United States Patent [19]
Ashigaki et al.

[11] Patent Number: 5,872,060
[45] Date of Patent: Feb. 16, 1999

[54] SEMICONDUCTOR DEVICE MANUFACTURING METHOD

[75] Inventors: Shigeo Ashigaki, Tsuchiura, Japan; Kazuhiro Hamamoto, Plano, Tex.

[73] Assignee: Texas Instruments Incorporated, Dallas, Tex.

[21] Appl. No.: 738,621

[22] Filed: Oct. 29, 1996

[51] Int. Cl.$^6$ .................................................. H01L 21/302
[52] U.S. Cl. ............................................ 438/697; 438/698
[58] Field of Search ...................................... 438/697, 698

[56] References Cited

U.S. PATENT DOCUMENTS

| | | | |
|---|---|---|---|
| 3,976,524 | 8/1976 | Feng | 438/698 |
| 4,666,553 | 5/1987 | Blumenfeld et al. | 438/698 |
| 4,789,646 | 12/1988 | Davis | 438/697 |
| 4,799,992 | 1/1989 | Rao et al. | 438/698 |
| 4,983,545 | 1/1991 | Gokan et al. | 438/698 |

*Primary Examiner*—Deborah Jones
*Attorney, Agent, or Firm*—William B. Kempler; Richard L. Donaldson

[57] ABSTRACT

A semiconductor manufacturing method for devices, such as a DRAM, having a plurality of circuit elements of at least two substantially different heights (such as memory-cells vs. peripheral circuits) on a common semiconductor substrate. A plurality of circuit elements of at least two substantially different heights are formed on a common semiconductor substrate. A common insulating layer, such as BPSG, whose top surface has substantial variation in height above the substrate, is deposited over the circuit elements. A resist mask layer is deposited over the insulating layer with openings over high portions of the insulating layer's top surface exceeding a first predetermined height. Then the insulating layer's high portions are etched down to a second predetermined height to make its overall top surface more even, and the resist mask layer removed. The enables a working layer that would be easily damaged by substantial height variation to be deposited on the evened insulating layer.

11 Claims, 33 Drawing Sheets

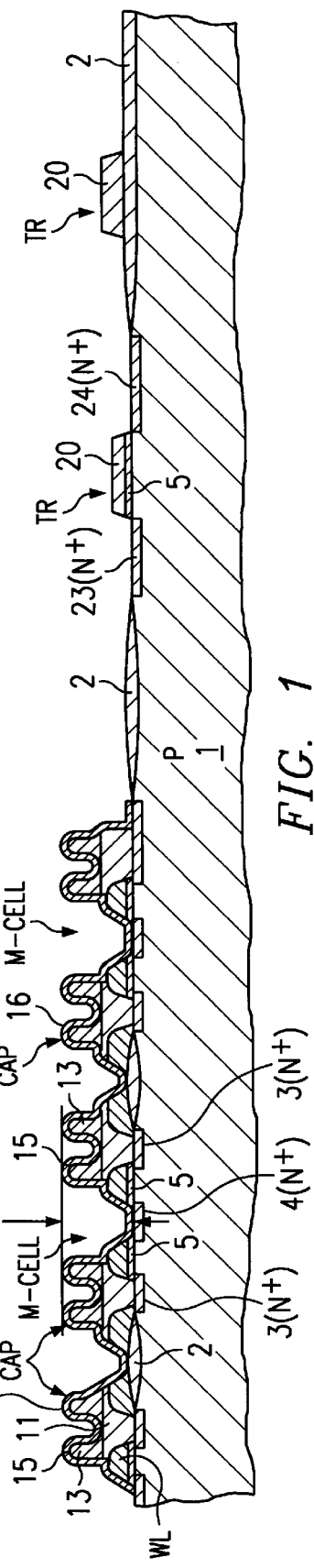
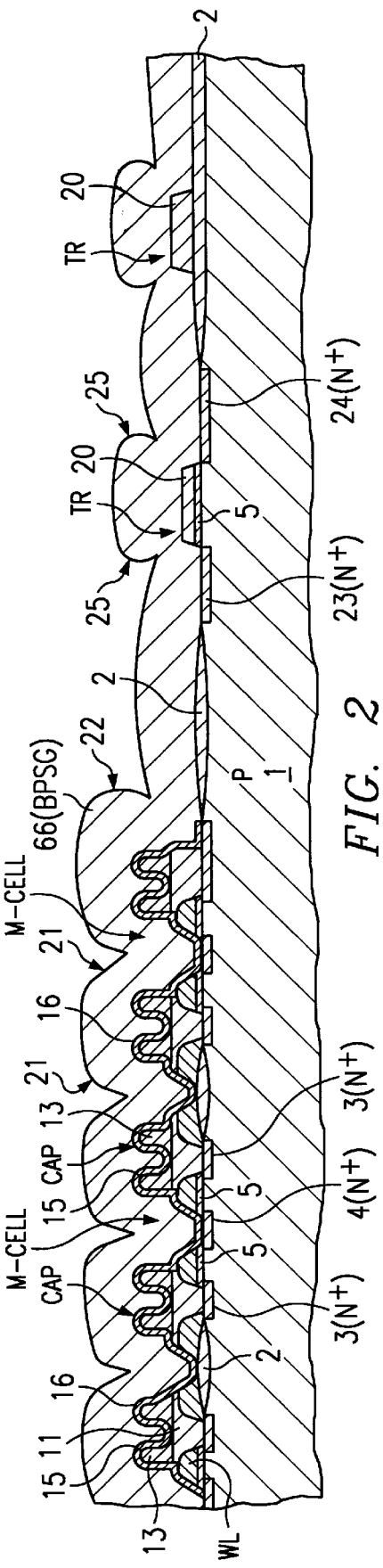

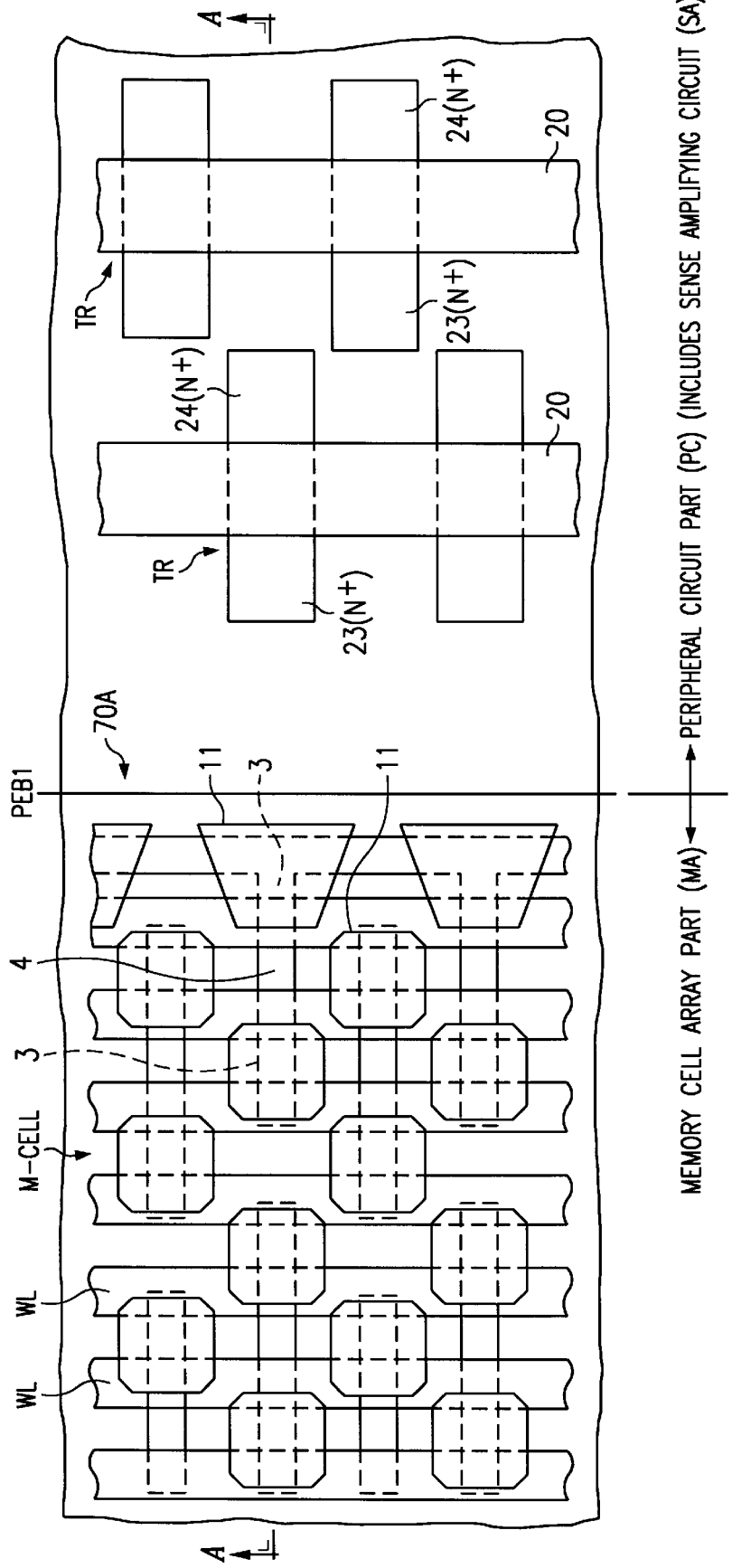

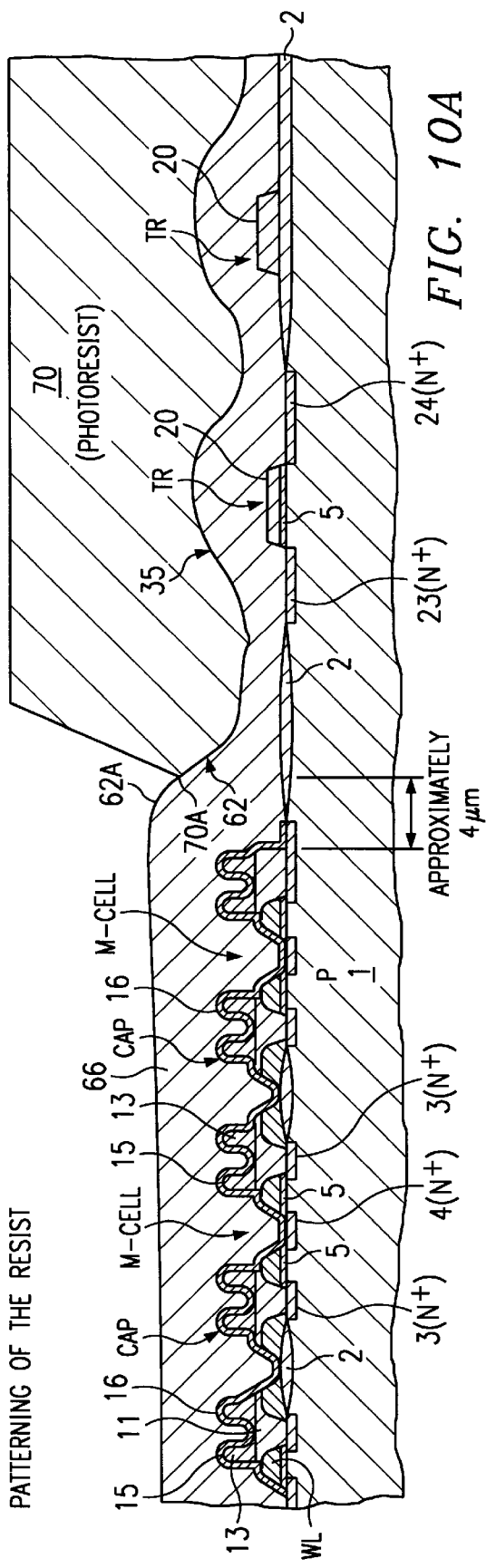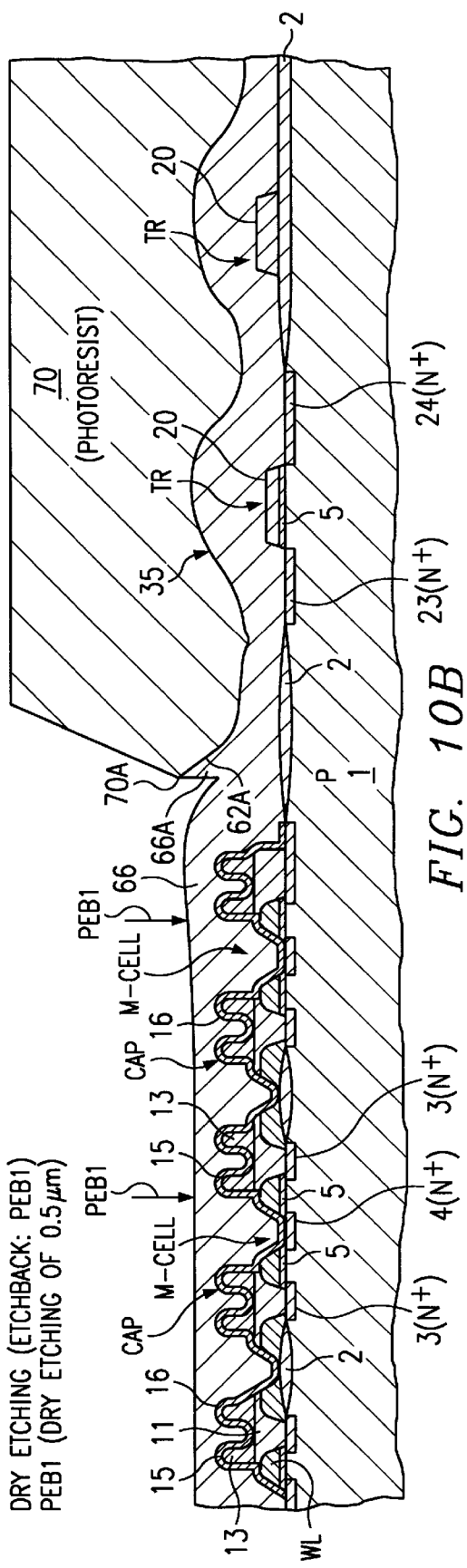

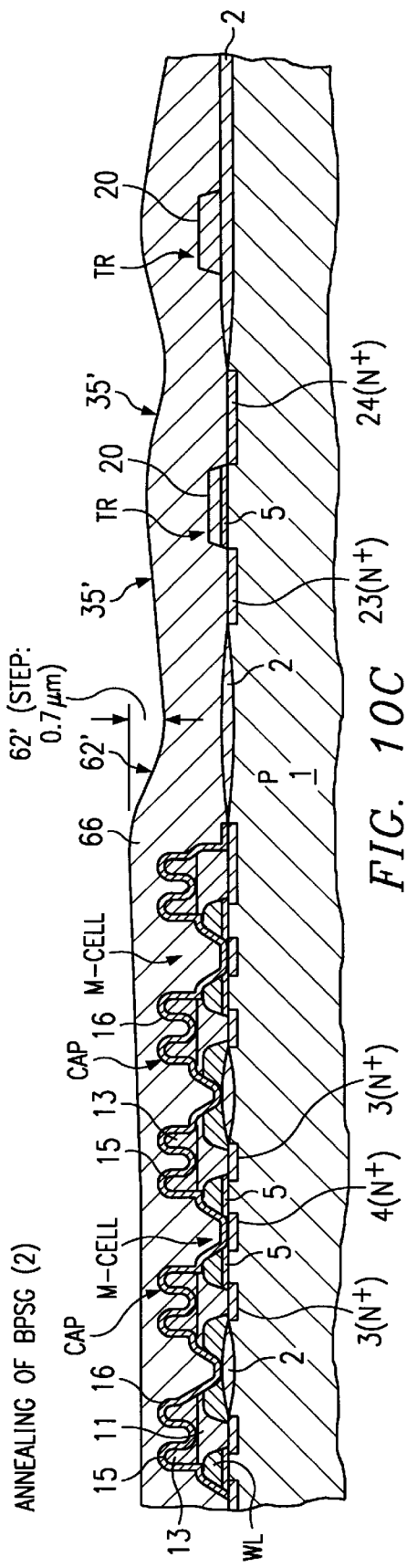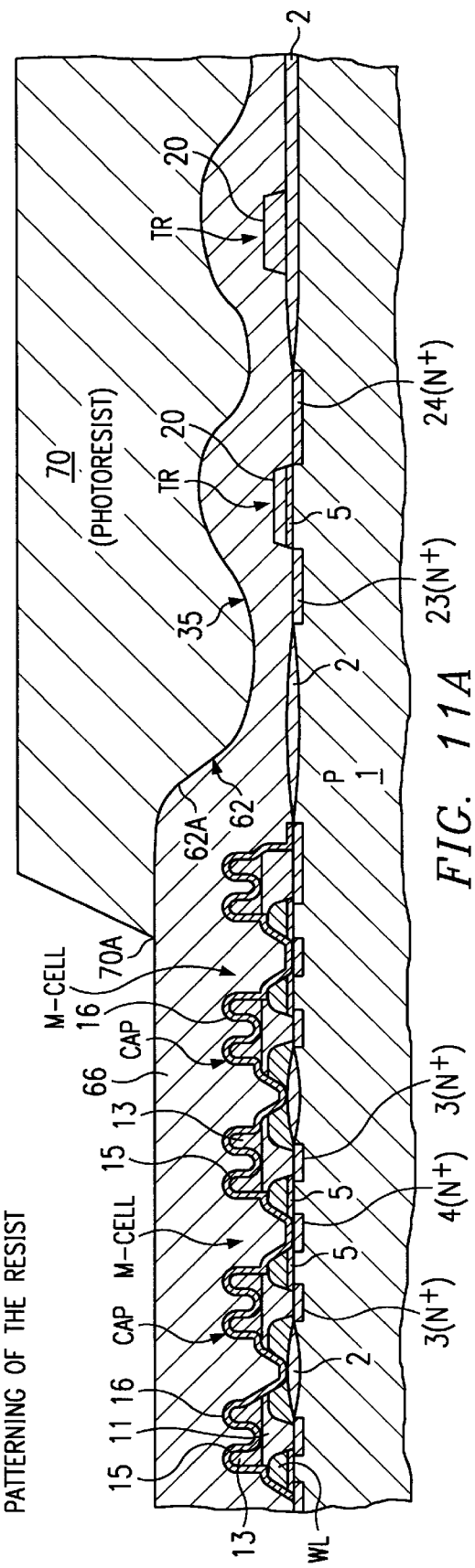

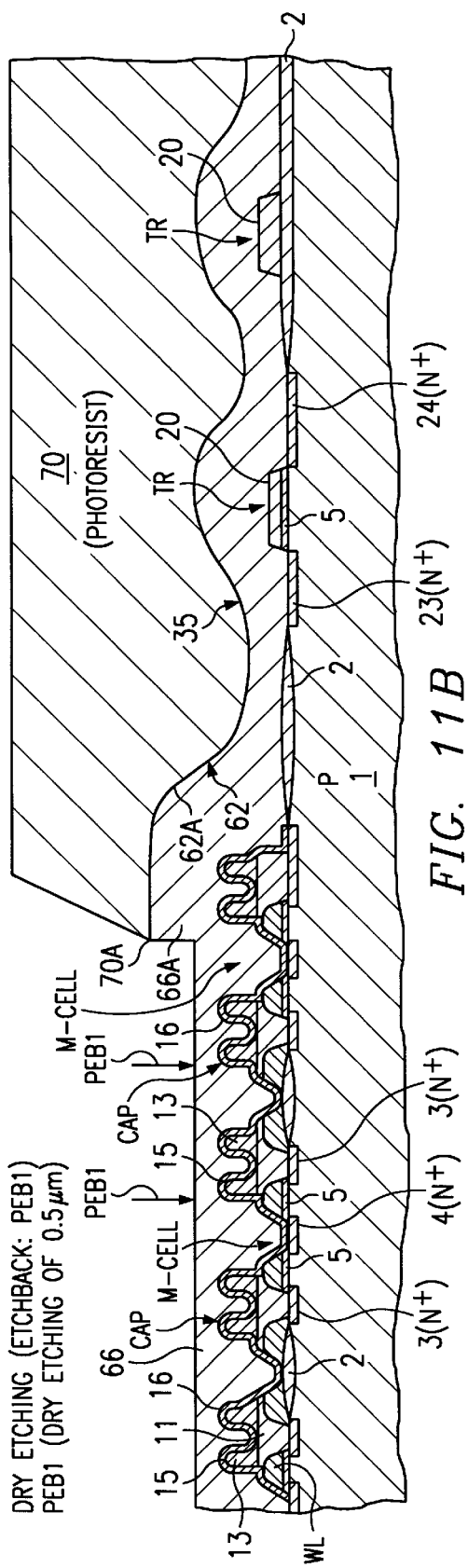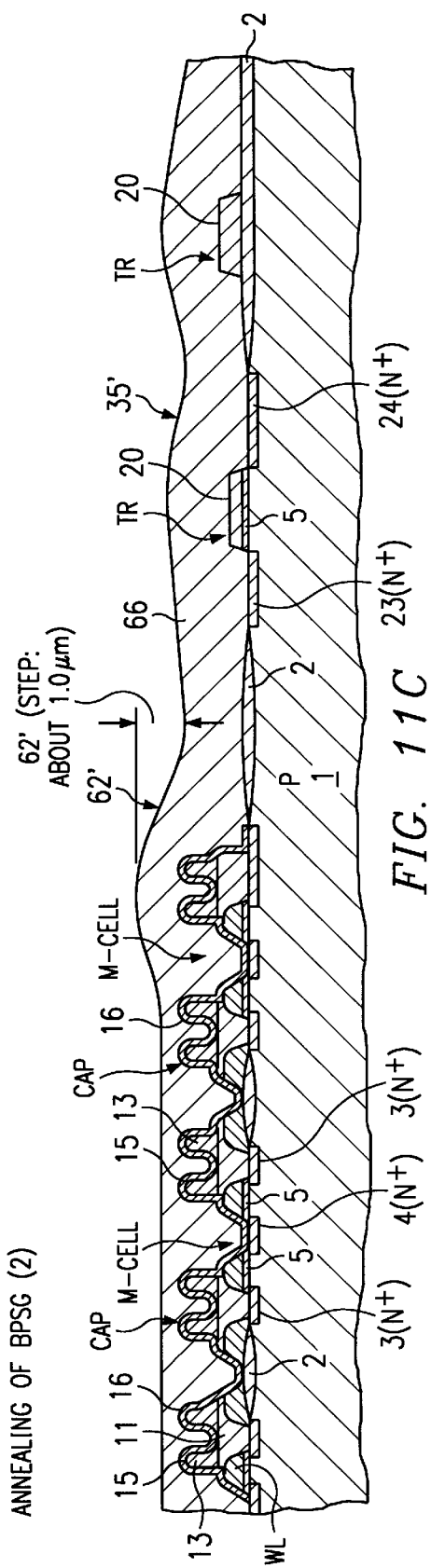

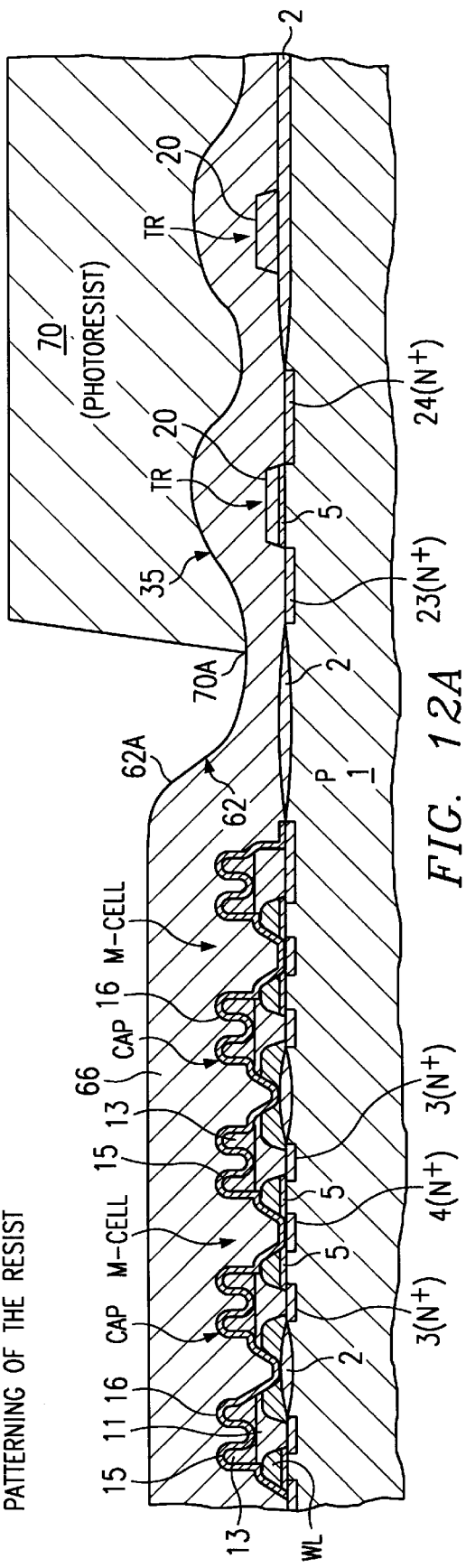
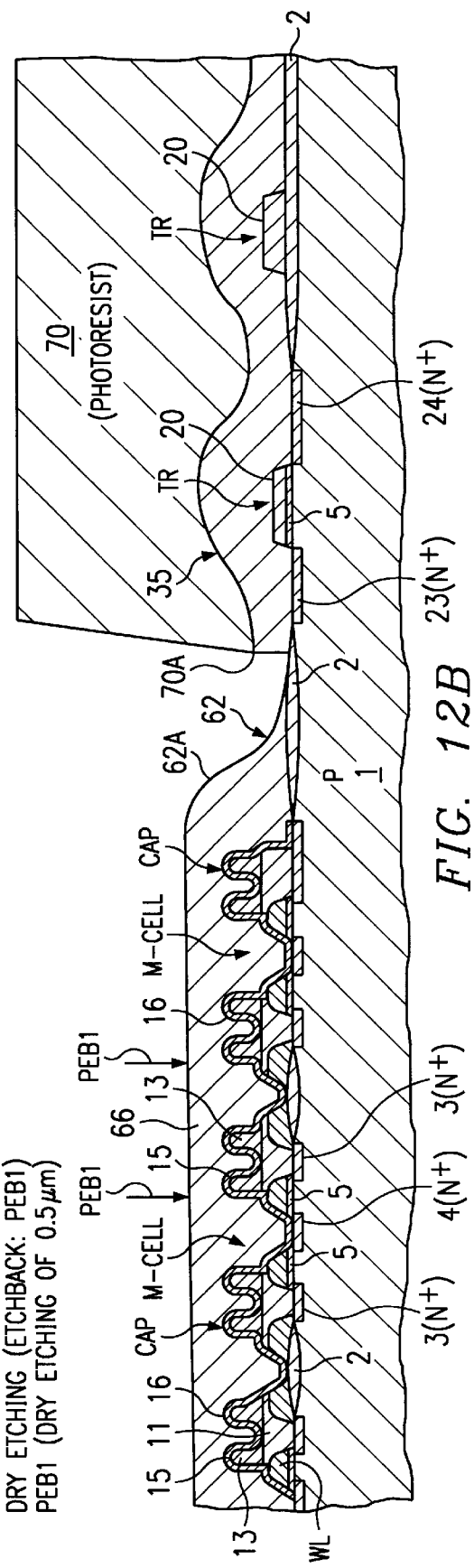

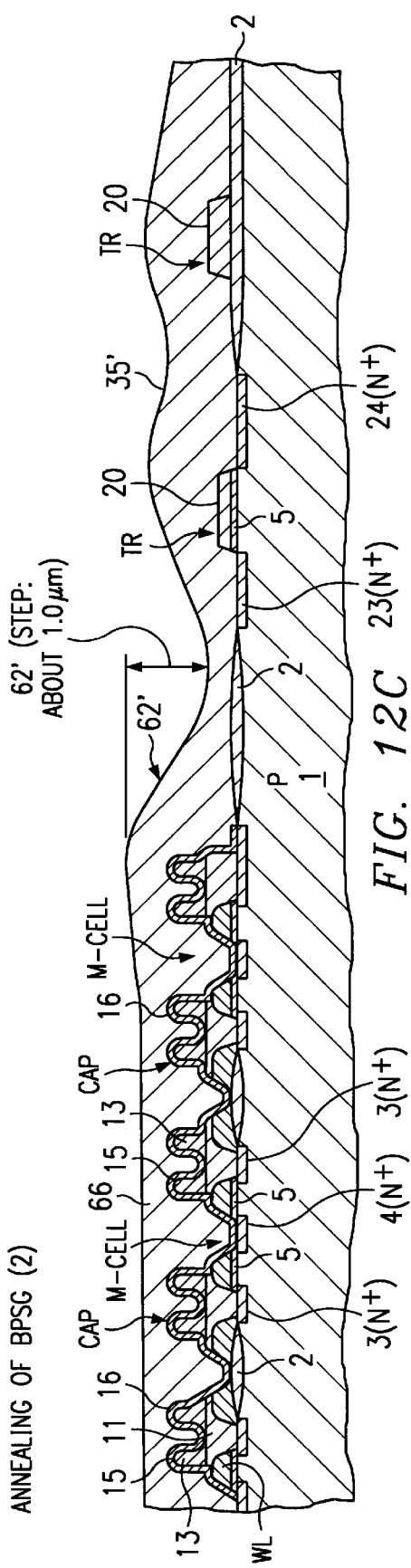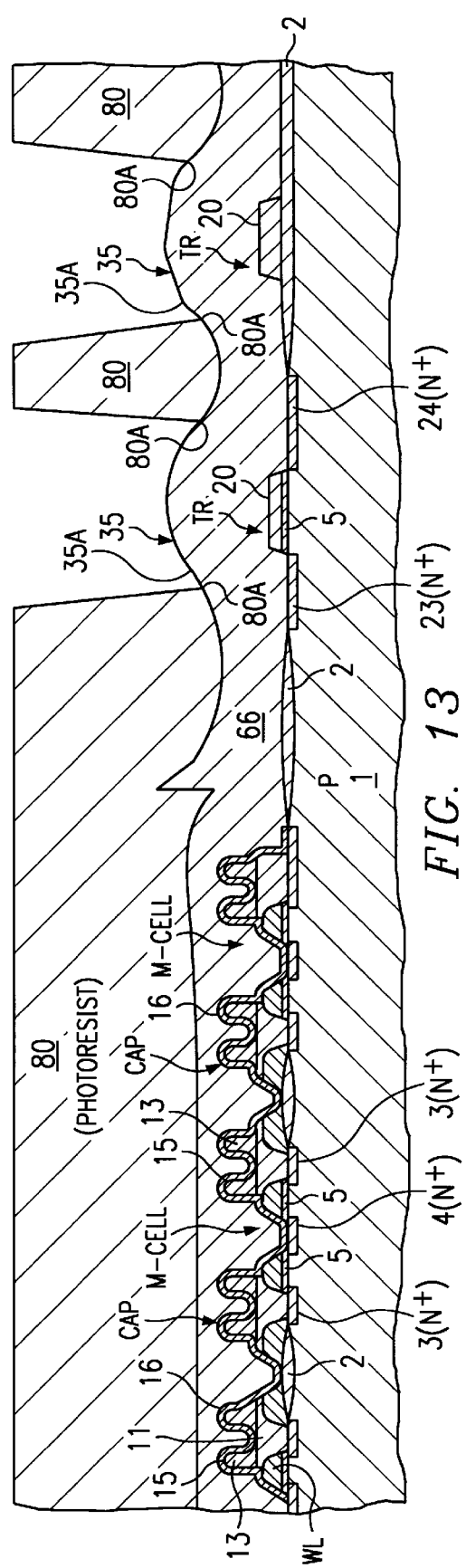

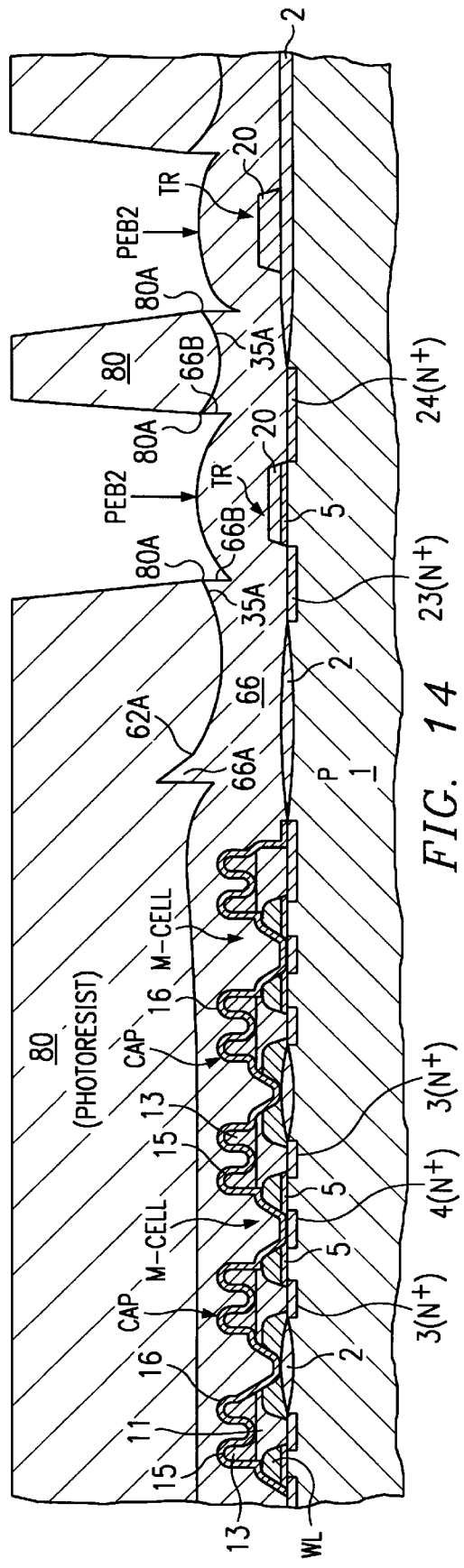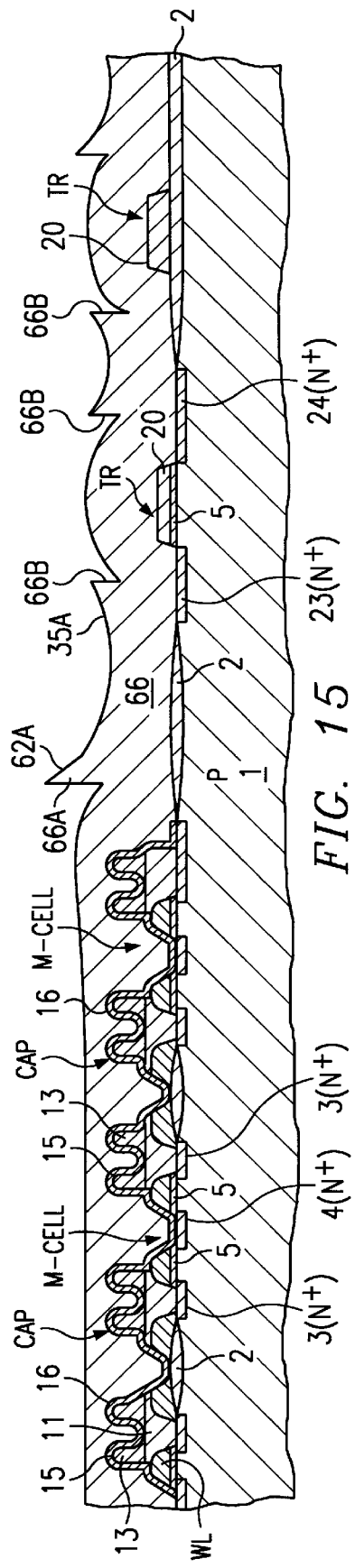

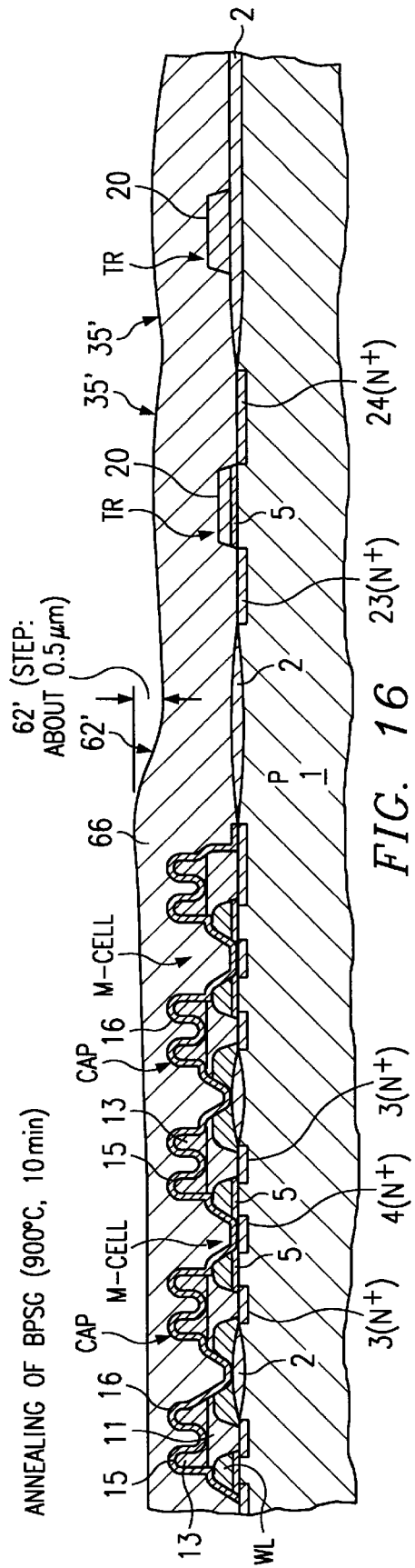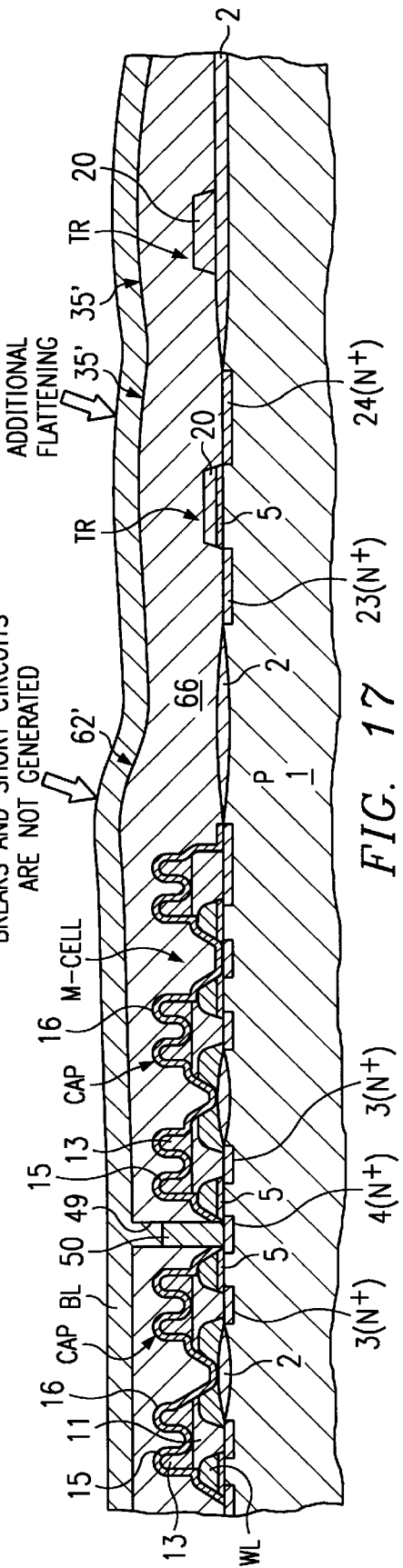

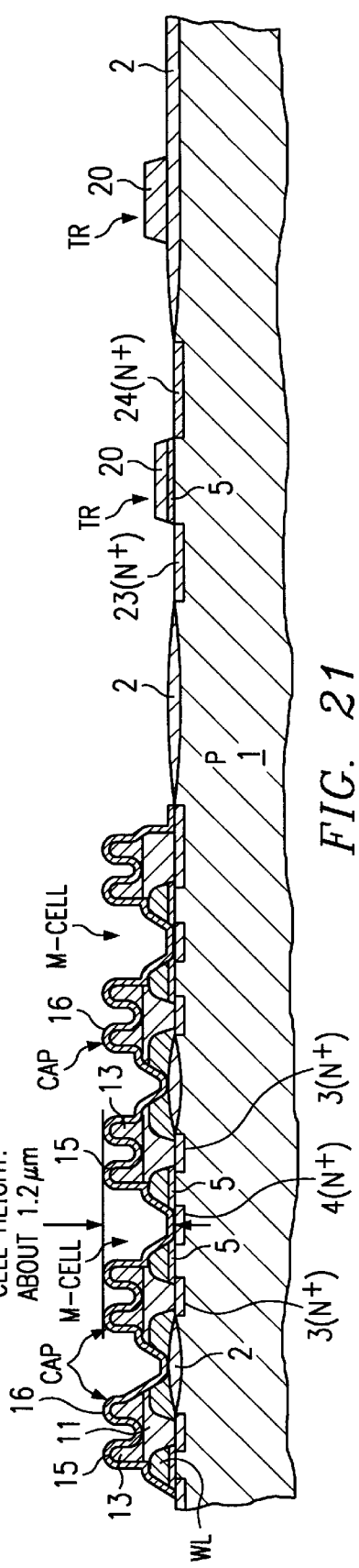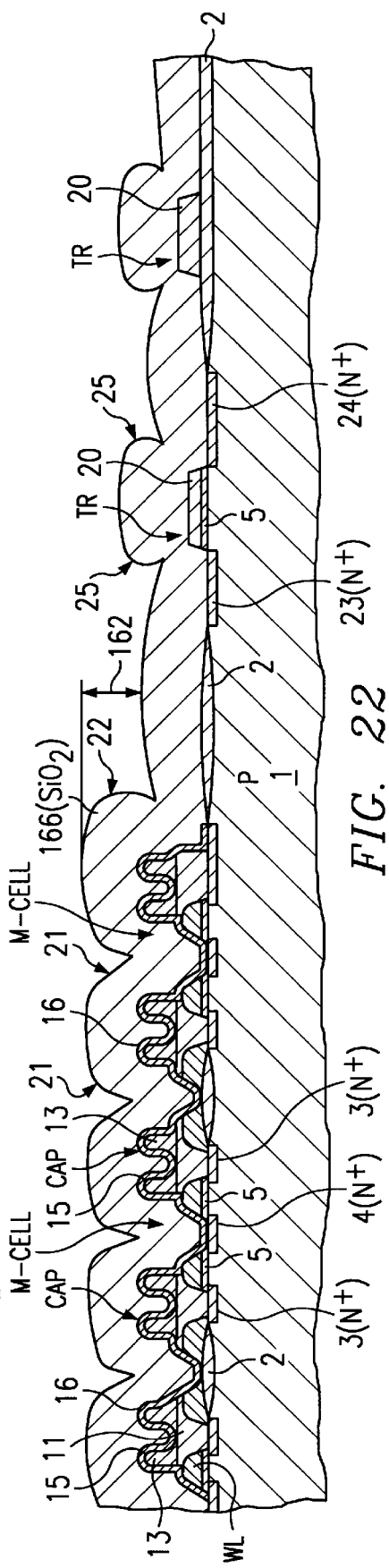

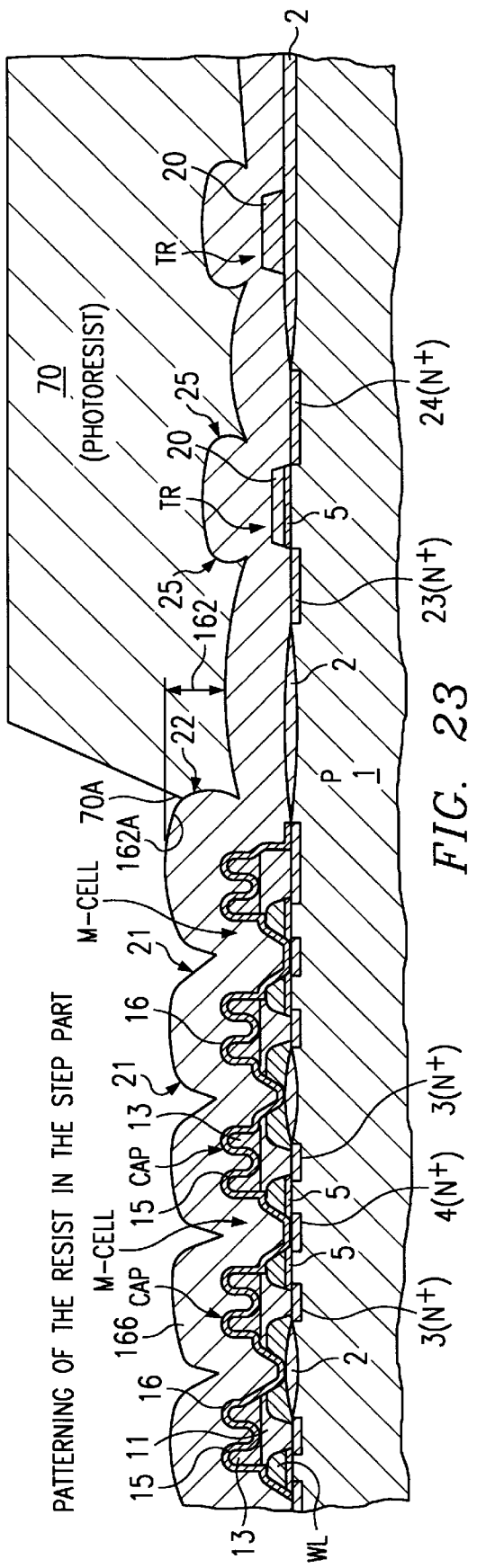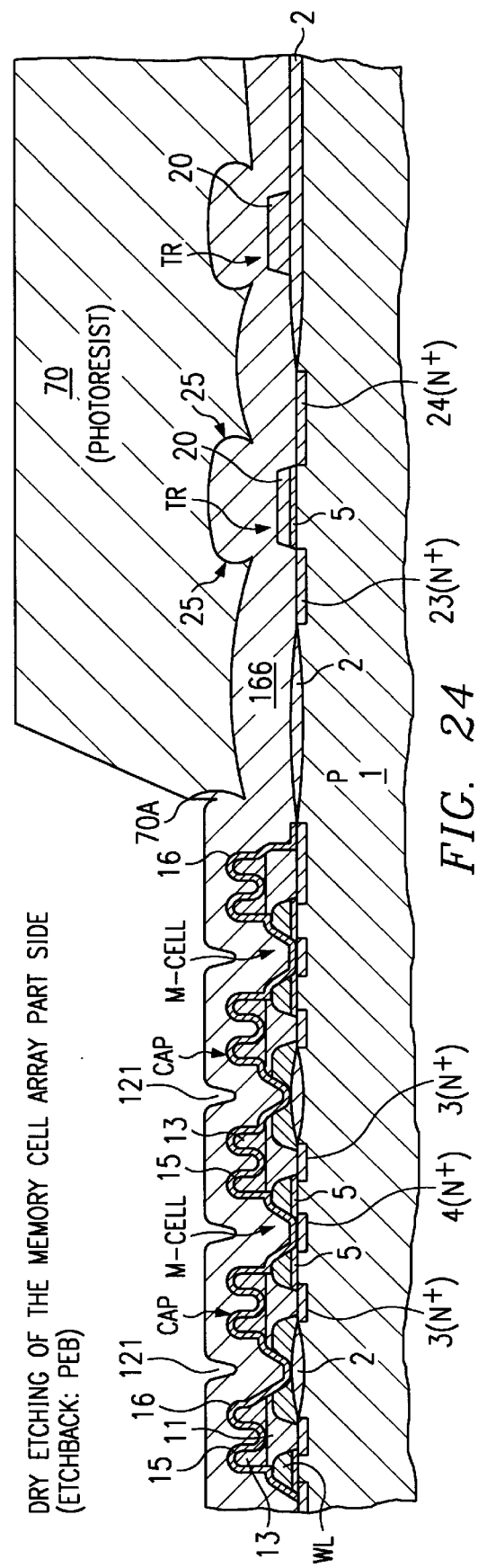

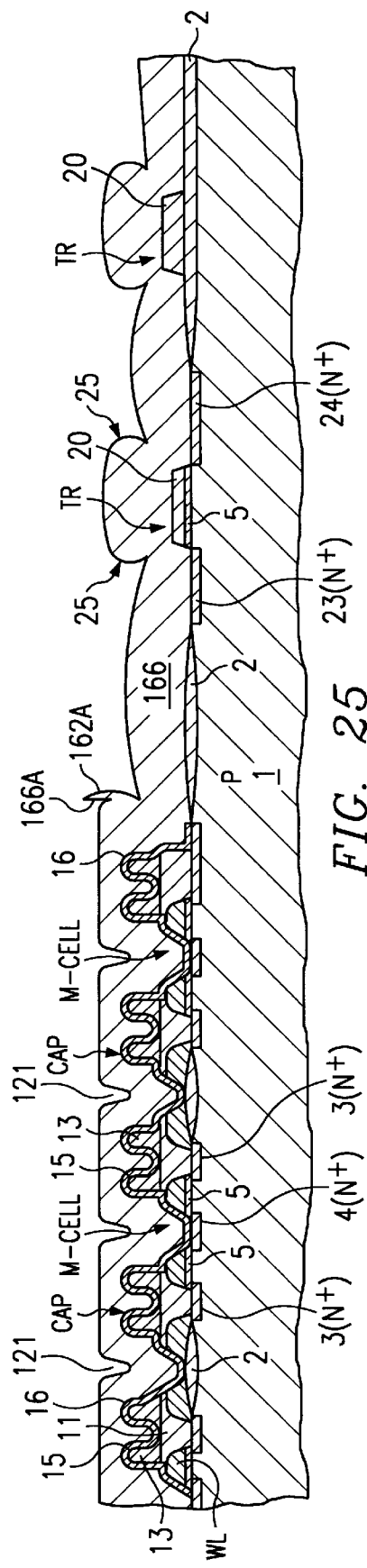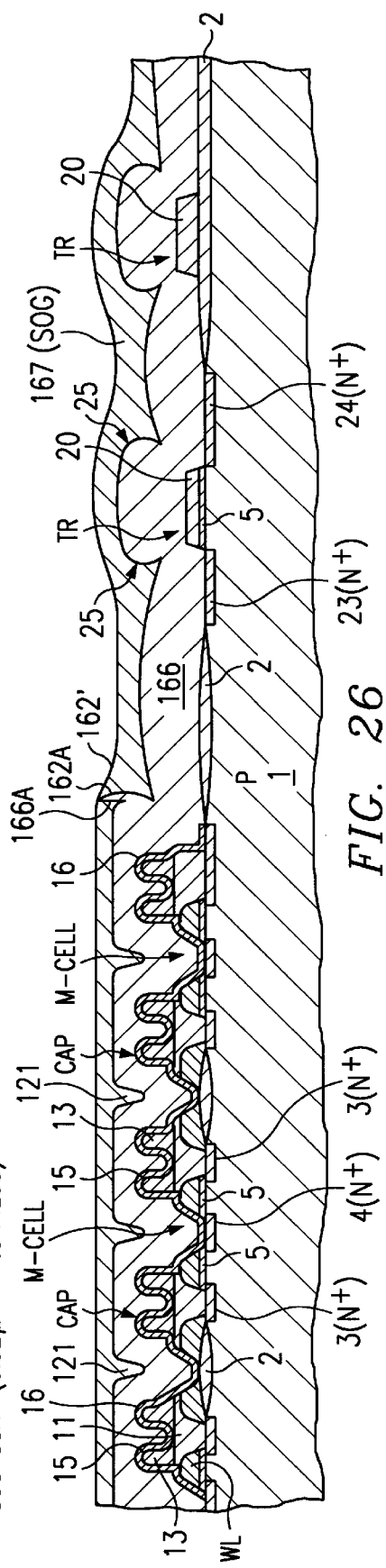

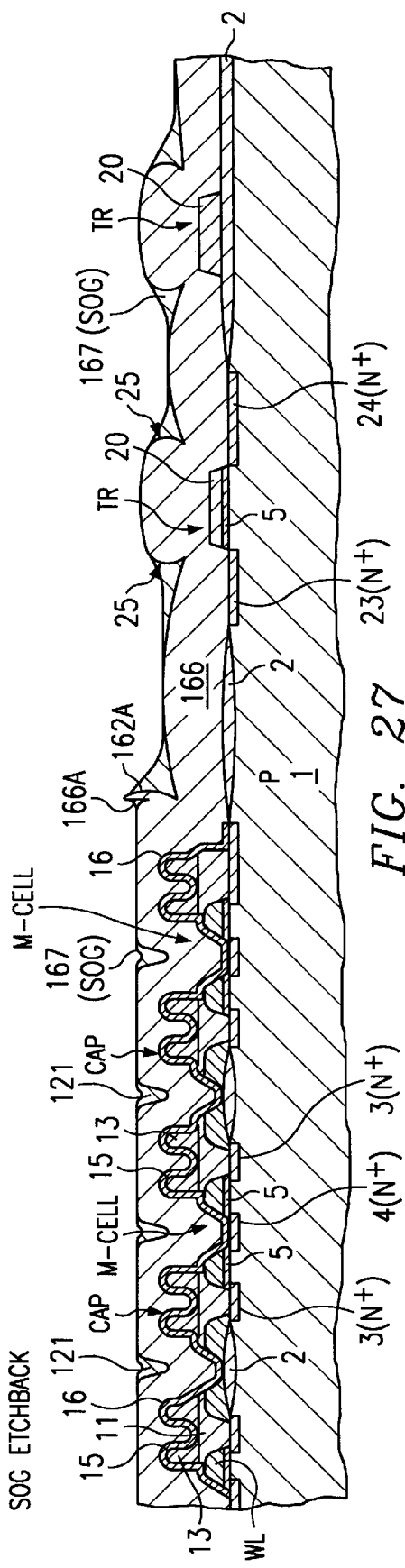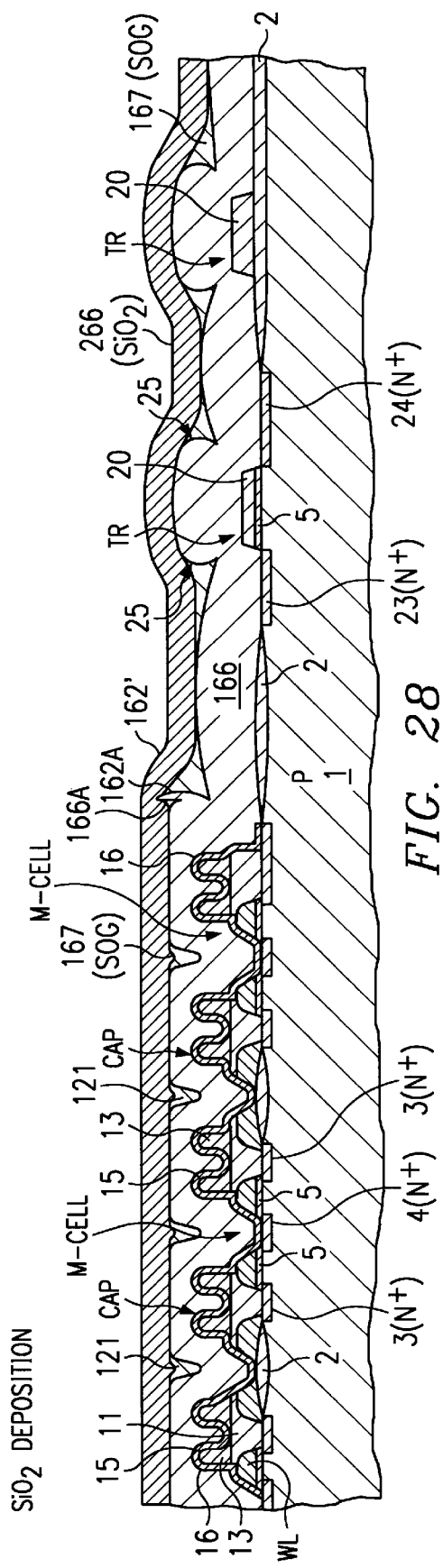

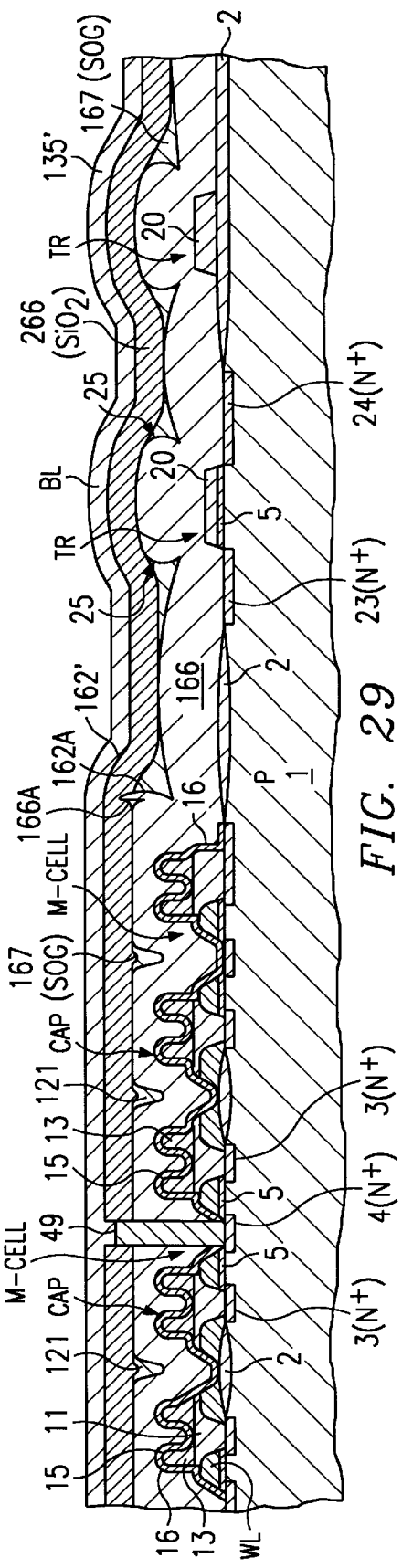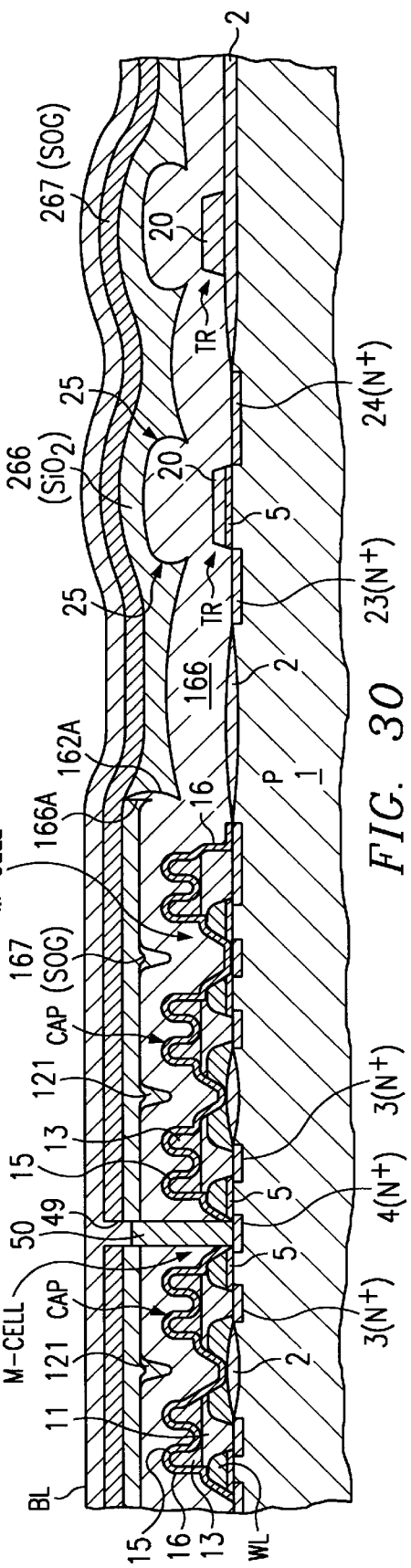

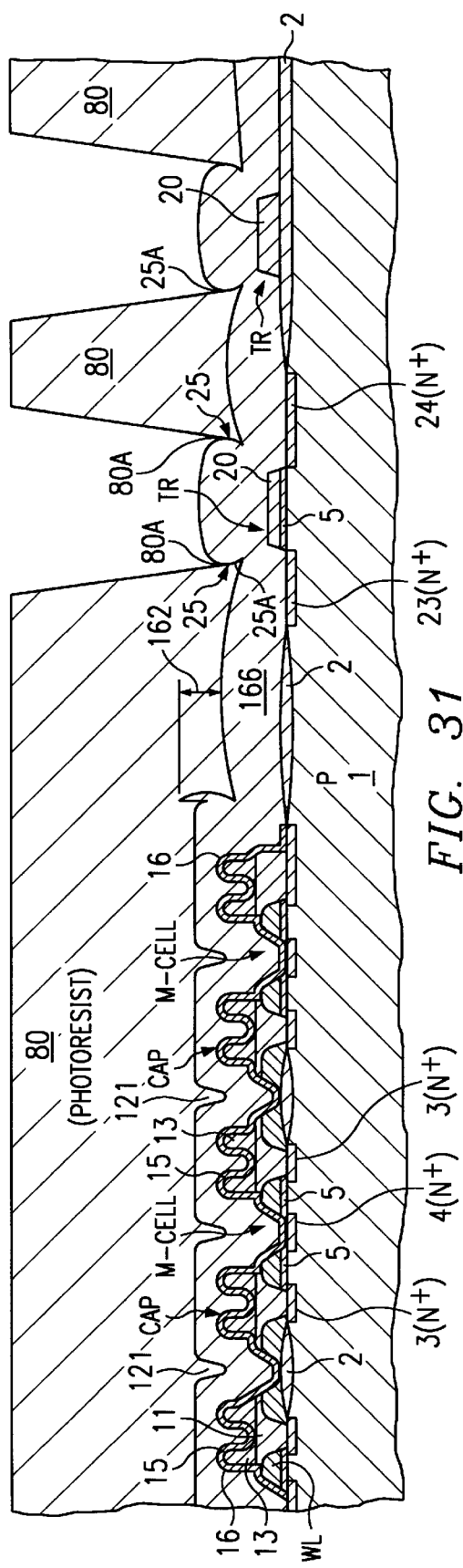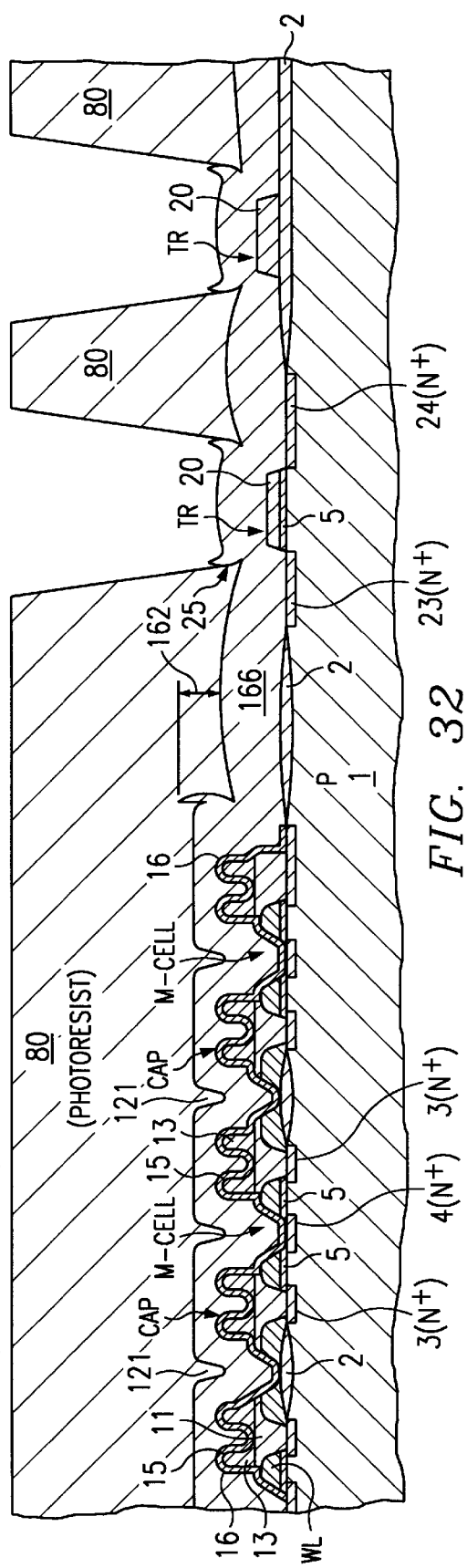

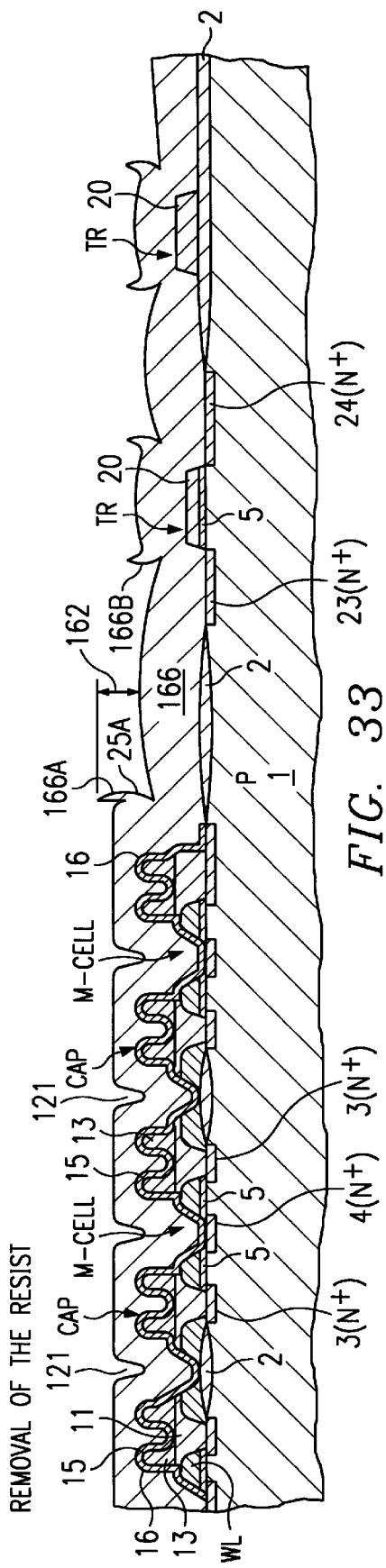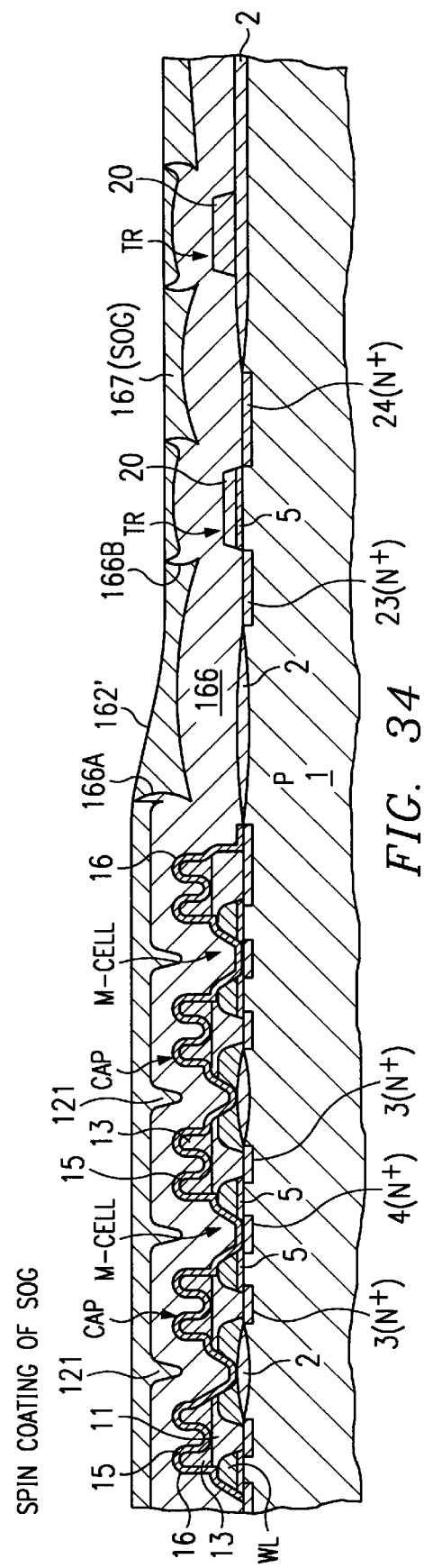

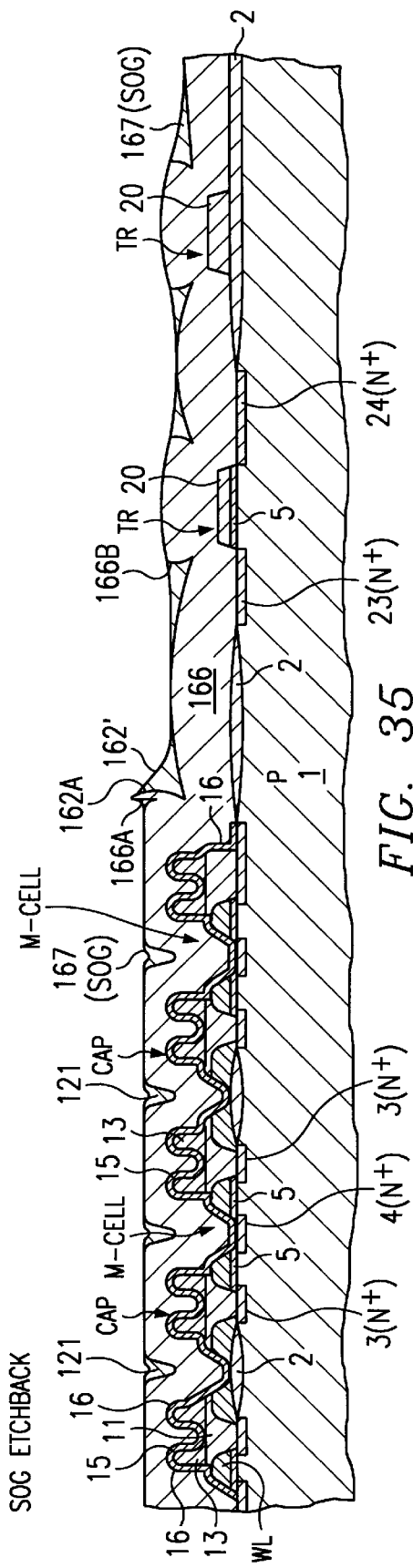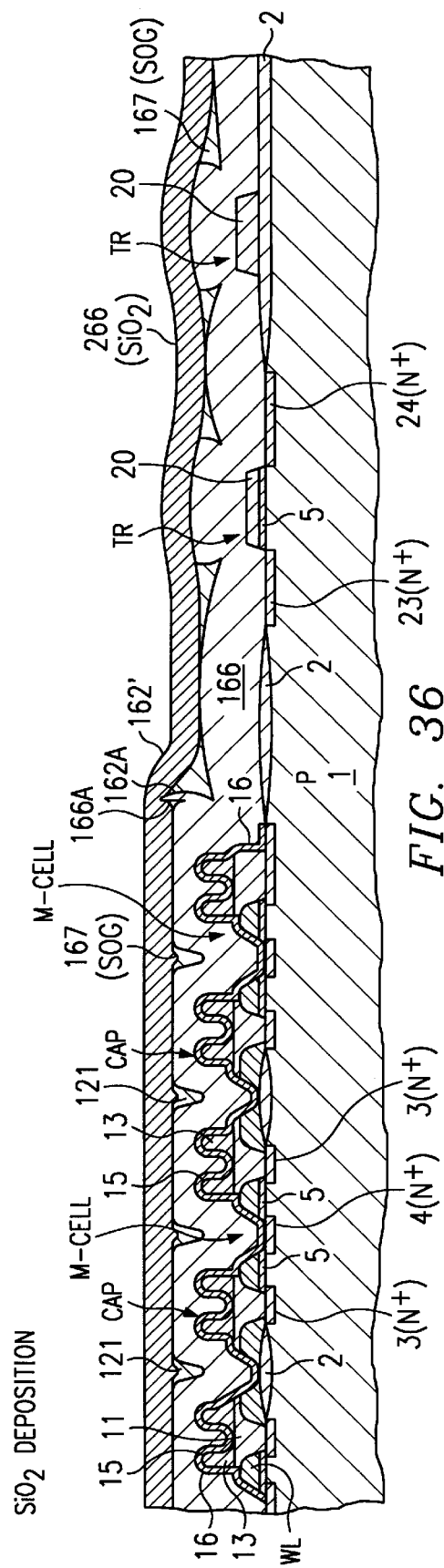

FORMATION OF GATE ELECTRODE PART

DEPOSITION OF BPSG (1.2μm)

ANNEALING OF BPSG (1) (850°C, 10min)

DEPOSITION OF SiO₂

PATTERNING OF THE RESIST

DRY ETCHING (ETCHBACK)

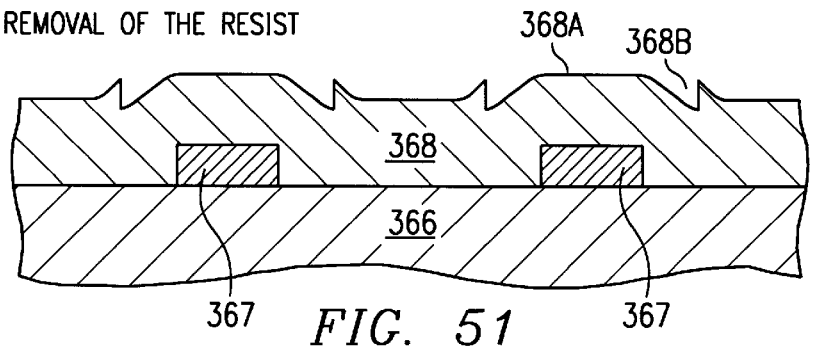
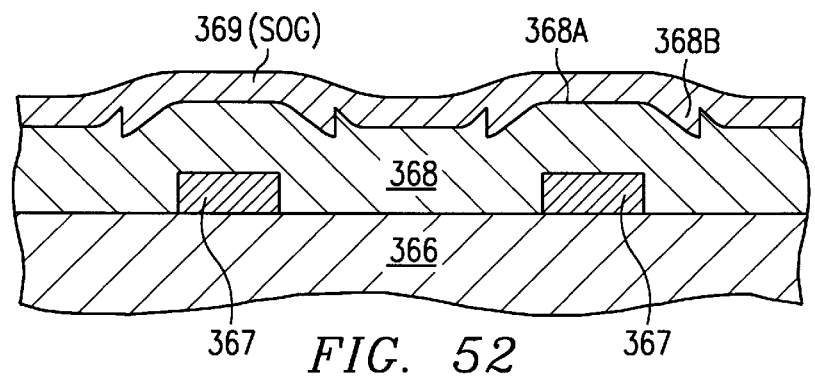
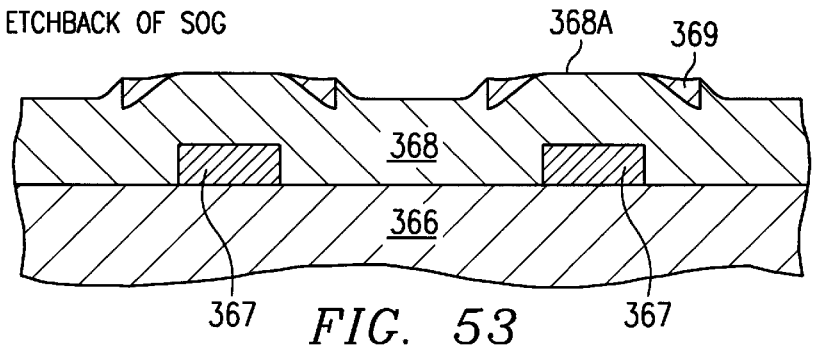
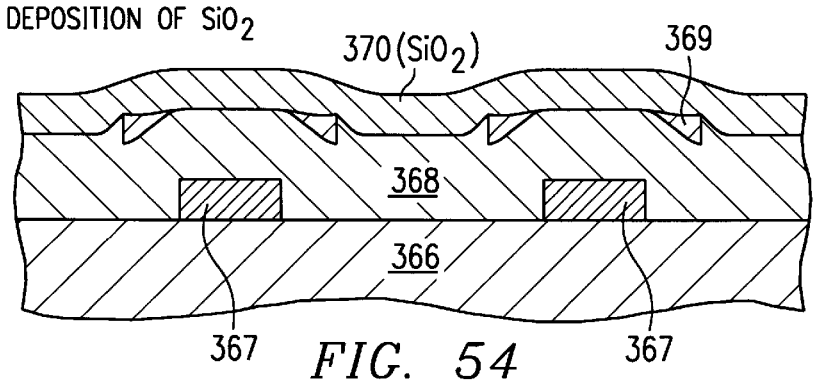

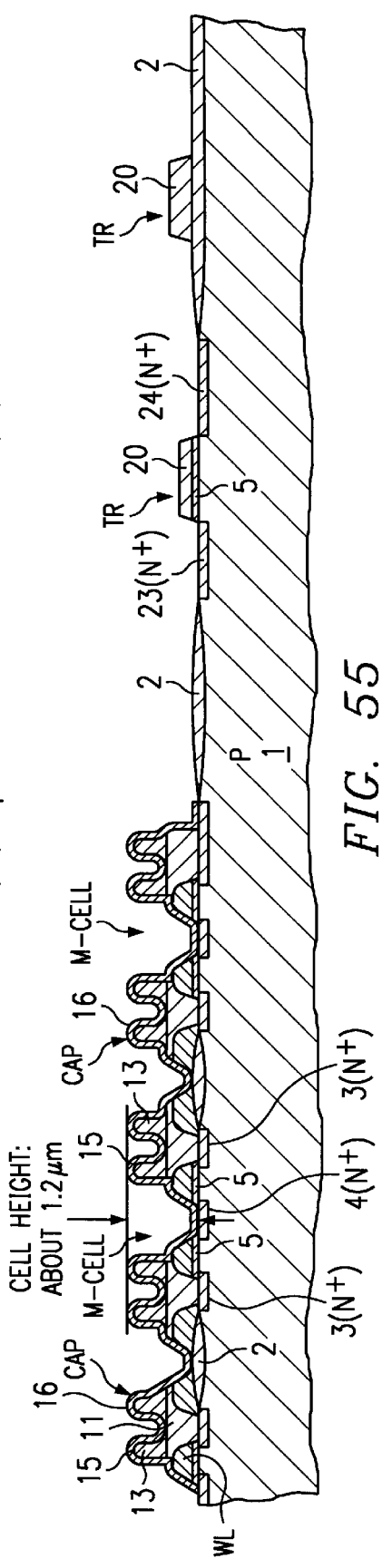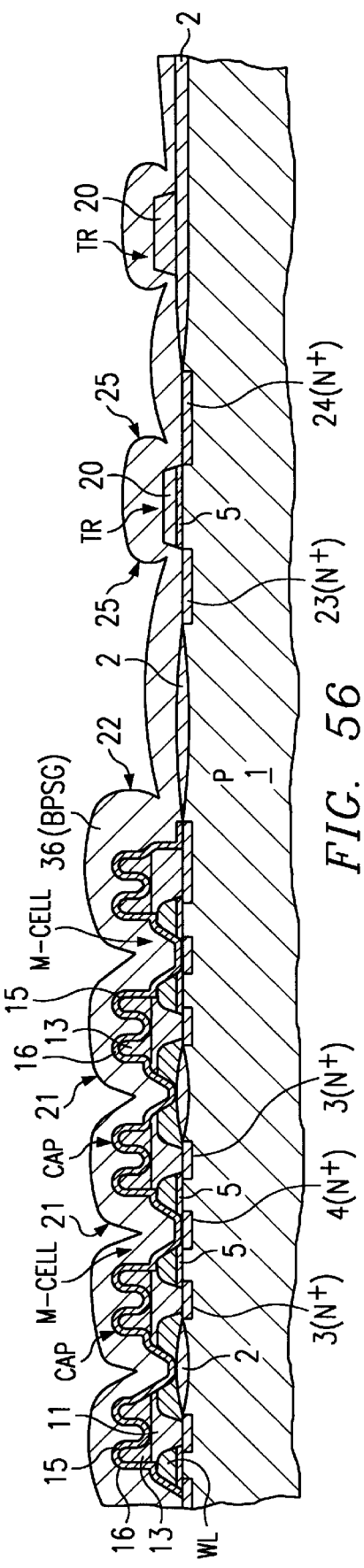

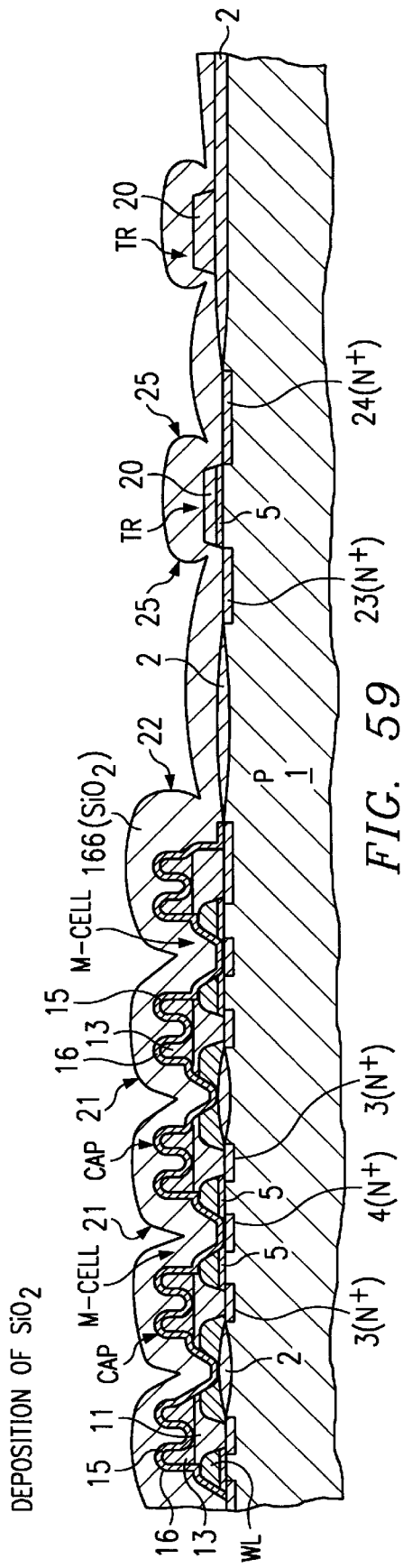
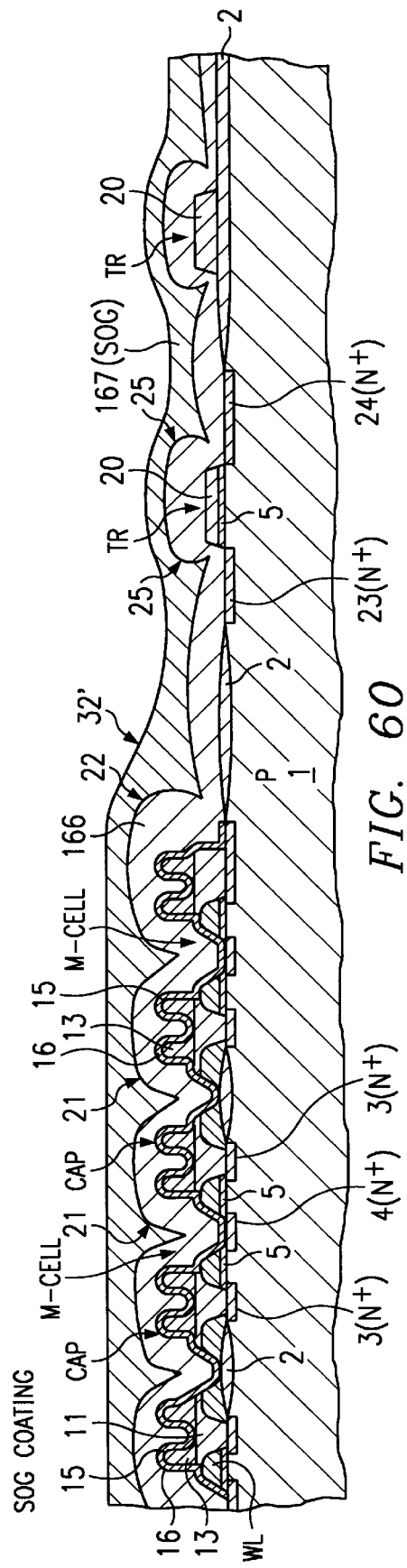

SEMICONDUCTOR DEVICE MANUFACTURING METHOD

FIELD OF THE INVENTION

Our invention relates to a method of making semiconductor devices, such as dynamic random access memory (DRAM) chips having a memory cell array portion and a peripheral circuit portion.

BACKGROUND OF THE INVENTION

In conventional DRAM memory cells having cylindrical stacked-cell capacitors, as shown FIG. 62, can be used to increase the capacitance of each memory cell. A gate oxide film 5 is formed in an element region separated by a $SiO_2$ field film 2 on a p-type silicon substrate 1. A word line WL composed of polysilicon and an $SiO_2$ layer 6 are formed on it, and $n^+$-type semiconductor regions 3 (source) and 4 (drain) are formed by the self-alignment method with the word line WL used as a mask.

Then an $SiO_2$ passivation layer 7, an $Si_3N_4$ substrate protection layer 8, and an $SiO_2$ layer 9 are successively formed over the entire surface. A polysilicon layer 11 (storage node) is formed to include a contact hole 10, which is formed on a part of the passivation layer down to the $n^+$-type source region 3, and to be connected to source region 3. A cylindrical polysilicon layer 13 is formed on polysilicon layer 11, and a bottom capacitor electrode is formed from polysilicon layers 11 and 13. Furthermore, a dielectric film, for example a $Si_3N_4$ film 15, is deposited over the entire surface of polysilicon layer 11, and a top capacitor electrode (plate electrode) such as a polysilicon layer 16 is formed on the $Si_3N_4$ layer.

Thus, a capacitor cap, having top and bottom capacitor electrodes 16, 11, and 13 and dielectric film 15, having increased capacitance due to screen type polysilicon layer 13 is connected to source region 3.

An interlayer insulating layer, for example, silicate glass layer (BPSG layer) 36 with doped boron and phosphorus, is deposited on top electrode 16 by the CVD method, and a contact hole 49 is formed in it down to $n^+$-type drain region 4. By adhering a bit line BL to contact hole 49 via polysilicon layer 50, a memory cell (M-CEL) for a 16 Mb or 64 Mb DRAM, for example, can be fabricated.

As shown in FIG. 55, this type of DRAM generally has a peripheral circuit portion PC and a memory cell array portion MA having many memory cells M-CEL. After an insulating BPSG layer 36 is formed on portion MA and peripheral circuit portion PC according to a process to be explained below, and wiring such as a bit line BL, etc., is applied. On one principal surface of p-type silicon substrate 1, many memory cells M-CELL (cell height about 1.2 $\mu$m, word line spacing about 0.4 $\mu$m, word line height about 3500 Å) with a stacked-cell capacitor cap as shown in FIG. 62 are formed into a memory array in a portion MA and MOS transistors TR for input/output circuits are formed in a peripheral circuit portion PC. Transistors TR are composed, for example, of a structure provided with a polysilicon gate electrode 20 between $n^+$-type source region 23 and $n^+$-type drain region 24 via gate oxide film 5.

Next, as shown in FIG. 56, a BPSG layer 36 is deposited to a thickness about 0.6 $\mu$m over the entire surface of substrate 1 by the CVD method. At the surface of this deposited layer 36, memory cells M-CELL are formed between word lines WL. In accordance with the thickness of the word lines and height of the cell capacitor cap, steps 21 are created in portion MA. Because a high structure such as a screen structure does not exist outside of the terminating part in portion MA (the distance between gate electrode 20 and word line WL of the memory cell is about 4 $\mu$m), a step 22 steeper than step 21 is created between portion MA and peripheral circuit portion PC.

We call step 21 in portion MA a "local step"; this is a step between multiple, relatively close word lines WL (or between the cells). Normally it is created when the distance between the word lines or between adjacent wiring is less than 10 $\mu$m.

We call larger step 22 between portion MA and peripheral circuit portion PC a "global step" in the present specification. This is quite steep and normally created when the distance between the word lines or between adjacent wiring is over 10 $\mu$m (however, it may be less than 10 $\mu$m according to the case).

Even in peripheral circuit portion PC, a step 25 may be created between gate electrodes 20 and 20 or on the gate electrode 20 side. But this has a smaller height difference than global step 22 (however, it may have a height difference greater than or equal to local step 21). Steps 21 and 22 and 25 must be eliminated and flattened in order to provide wiring reliably on BPSG layer 36. For this purpose, BPSG layer 36 is caused to reflow by annealing for 10 min at 900° C. in the state of FIG. 56.

However, while local step 21 in portion MA is essentially eliminated, step 25 in portion PC becomes a gradual slope like 35, and the steepness of global step 22 becomes reduced. However, as shown in FIG. 57, it is difficult to flatten out the large height difference in the vicinity of global step 22. So a global step 32 with height difference about 1.2 $\mu$m is left between portion MA and portion PC.

Then in FIG. 58, a contact hole 49 is formed at a prescribed location in BPSG layer 36 and prescribed wiring, in particular, a bit line BL is formed via a polysilicon layer 50. Due to the large step differences at global step 32, breaks and short circuits tend to form in wiring BL during photolithography. When, for example, a positive photoresist is thickly deposited where the breaks occur, exposure to the bottom part of the photoresist is not possible, and short circuits occur or the exposure part of the photoresist that should not be exposed is exposed due to the irregular reflection caused by the slope of step 32, etc., changes occur in the pattern width of the wiring formed by etching using a photoresist with pattern as a mask, and there may be corresponding breaks in the wiring.

Also, when aluminum is used for wiring BL, breaks may be generated during use in the step part due to so-called electromigration even if breaks are not generated during fabrication.

The spin-coating of SOG (spin-on glass) which is different from the aforementioned method is used to eliminate the step and to produce the wiring reliably. $SiO_2$ insulating layer 166 is provided is accordance with the plasma CVD method as indicated by the segmented line in FIG. 62. Insulating layer 166 formed in accordance with the plasma CVD method, which has the advantage of superior insulating properties, precise formation, and the ability to be formed at low temperatures, is used mainly for the flattening of the metal wiring; high-temperature annealing to create reflow, as with BPSG, is not executed. Thereafter, the surface is made flat by spin coating SOG 167 on insulating layer 166. This structure is fabricated according to the procedure shown in FIG. 59–61.

As shown in FIG. 59, $SiO_2$ insulating layer 166 is deposited to a thickness of 0.6 $\mu$m over the entire surface of substrate 1 in accordance to the plasma CVD method. In the surface of the deposited layer 166, memory cells M-CELL are formed in accordance with the height of cell capacitor cap, and the thickness of word line WL, etc., and local step 21 is created in portion MA; on the other hand, a projecting structure such as a screen does not exist on the outside of the terminating part of portion MA (the distance between gate electrode 20 and word line WL of the memory cell is about 4 $\mu$m) so that global step 22 steeper than step 21 is created between portion PC and portion MA.

Then SOG 167 is spin-coated over the entire surface of insulating layer 166 as shown in FIG. 60. In this state, the top of local step 21 becomes flat according to insulation layer 167, but step 32' greater than 1.0 $\mu$m is formed on global step 22 according to the height difference of the two sides.

When bit line BL is deposited on SOG layer 167 as shown in FIG. 61, breaks and short circuits in wiring BL occur easily on step 321 for the same reasons explained in connection with FIG. 58.

Thus, the aforementioned methods decrease the reliability of the wiring, limit the refinement of the wiring width and pitch, and are very disadvantageous for the fabrication of high-integrated semiconductors.

The object of our invention is to provide a semiconductor device manufacturing method in which the flattening of the insulating layer, such as the BPSG layer or SOG layer, can be executed easily, and the wiring, etc., can be formed with good reliability and with a wide tolerance in the subsequent processes.

SUMMARY OF INVENTION

Our invention pertains to a semiconductor device manufacturing method in which an insulating layer is formed on a surface with irregularities and/or steps. First an insulating layer is formed on the surface with irregularities and/or steps. A resist is applied on the insulating layer except for those portions projecting above a certain height. Using the resist as a mask, the projecting portions of the insulating layer are etched down, and the resist removed. Then a prescribed working layer or film can be formed on the flattened insulating layer. The "projecting part" means mainly a location on the high side with global step 62 (to be discussed below) as the boundary.

Our invention also provides a method of making a semiconductor device in which a global step exists according to the difference in the prescribed circuit configuration formed on a semiconductor substrate between a memory cell array portion and a peripheral circuit portion. The following processing steps are executed: an insulating layer is formed on the surface having at least the step in the memory cell array portion and the peripheral circuit portion. A resist is formed on the insulating layer except at the position on the side higher than a given position on the slanted surface for forming the step. Using the resist as a mask, the projecting portion of the insulating layer is etched down by just a prescribed thickness. Then a prescribed working layer or layers can be formed on the smoothed insulating layer.

Our invention also provides a semiconductor device manufacturing method for a semiconductor device in which local step exists according to the convex part of a prescribed circuit formed on a semiconductor substrate, the following processing steps are executed: a step for forming an insulating layer on a surface containing the convex part, a step for forming a resist on the insulating layer, except for the projecting portions of the surface composing the convex part, a step for removing the projecting portions of the insulating layer by just a prescribed thickness where the resist is used as a mask, and a process for forming a prescribed film on the insulating layer after removing the resist.

In our invention, it is preferable to use a silicate glass film as the insulating layer.

As described above, it is preferable to include a step for flattening the silicate glass insulating layer by applying a heat-treatment process after the silicate glass is formed on the surface with irregularities and/or steps.

Also, it is possible to form a silicon dioxide film as the insulating layer in our invention.

As described above, it is preferable to include a process of spin-coating SOG on the flattened silicon dioxide film.

As described above, it is preferable to leave the SOG in the concave portions of the silicon dioxide insulating layer by etching back the SOG and to form a second silicon dioxide insulating layer on the insulating layer with SOG.

Also in our invention, it is preferable to pattern the resist layer so that the resist terminating part is positioned at the slope of the step and/or convex part and to remove the insulating layer uniformly on the higher side than the resist layer by etching just a prescribed thickness with the resist layer used as a mask.

As described above, it is preferable to remove the projecting portion remaining after etching.

In the manufacturing method of our invention, it is possible to remove the projecting portions present on the side lower than an optional position of the step according with a heat-treatment process after removing the layer part on the high side by just a prescribed thickness according to the aforementioned description. Furthermore, it is possible to flatten the layer surface as well as eliminate the projecting portions.

As described above, the step formed by the high and the low portions is not reflow-treated as described above but is heat-treated after removing the layer part on the side higher than an optional position on the slanted surface forming this step by just a prescribed thickness, so that it is possible to execute the subsequent heat treatment wherein the height of the step and the thickness of the layer are made to correspond to the amount of thickness removed.

Therefore, the volume (determined by the height, width, and length) of the projecting portion existing on the side lower than the given position of the step (i.e., the part remaining after the layer part is removed by just a prescribed thickness) is minimal during the heat treatment, so that the projecting portion can be easily eliminated by a heat-treatment process, and as a consequence, it is possible to make the height difference of the high and low parts quite small to reliably and sufficiently flatten the layer.

This results in a good adhesion property of the wiring, such as the bit lines, etc., with respect to the layer, particularly with respect to the steps so that reliable wiring without breaks can be formed. Also, the photoresist can be exposed in accordance with the desired pattern during the formation of the wiring so multiple adjacent wirings can be formed at the prescribed width and intervals (or pitch).

Therefore, it is possible to execute a highly dense, fine wiring process and with wide tolerance. In particular, with strict design rules for minimum line width or intervals (e.g., less than 0.4 $\mu$m), the tolerance for the focusing depth for the exposure during photolithography is not too large; however, by flattening the steps in accordance with our invention, the processing tolerances can be increased.

In order flatten the steps, a so-called CMP (Chemical Mechanical Polishing) technology has been proposed in recent years, but the flattening method of our invention is superior to CMP in that the generation of dust is minimal, and no equipment is required.

In the manufacturing method of our invention, it is preferable to pattern the resist layer to the prescribed design so that the terminal end is positioned on the slope forming the step, to remove the layer uniformly on the side higher than the resist layer by just a prescribed thickness by etching with the resist layer used as a mask, and then to execute a reflow process wherein the resist layer is removed when flattening the steps. In this case, it is preferable to remove the layer uniformly on the side higher than the position of median height on the slope of the step by just a prescribed thickness.

Also, it is preferable to pre-anneal the insulation layer (e.g., the BPSG layer to be discussed below) that contain steps and to flatten the steps remaining after the aforementioned pre-annealing with the above-described method (i.e., removal of the side higher than a given position on the slope of the step by just a prescribed thickness followed by elimination of the projecting portion with a heat-treatment). At this time, pre-annealing can be executed for 10 min at 850° C., heat treatment (reflow) for 10 min at 900° C., and thus, steps about 1.2 $\mu$m can be reduced to about 0.7 $\mu$m.

In the manufacturing method of our invention, it is preferable to form the insulating layer (e.g., BPSG layer to be discussed below) accordance with the CVD method. It is possible with the CVD method to deposit uniformly an insulating layer of high purity.

In the manufacturing method of our invention it is also possible to flatten the surface of the layer as well as essentially embed the projecting portions by depositing insulating material after the high parts are removed by just a prescribed thickness.

In this case, it is preferable to form the insulating layer (e.g., $SiO_2$ insulating layer 166 to be discussed below) in accordance with the plasma CVD method. According to the plasma CVD method, in addition to the advantages of the CVD method, the layer can be formed at a low temperature of 300°–400° C., so that thermal damage to the elements already formed can be minimized; the method is therefore convenient.

Due to the fineness of the insulating layer formed in accordance with the plasma CVD method, the surface cannot be flattened in a reflow process with applied heat. Consequently, flattening is executed by deposition of insulation material. Spin-coating of SOG (spin-on glass) is therefore favorable from the standpoint of flatness and efficiency. Spin-coating is executed at 3000–4500 rpm at a temperature of 400°–450° C. for 30–60 min, which is favorable from the standpoint of view uniformity of film thickness, embedding property, film quality, etc.

After SOG is spin-coated, it is preferable to remove the SOG layer by just the prescribed thickness by etching, followed by forming an insulating layer in accordance with the plasma CVD method on the SOG insulating layer, which now has the prescribed thickness, in order to prevent cracks, etc., due to the difference in the thermal contraction and the $SiO_2$ insulating layer, etc., formed in accordance with the CVD step and in order to prevent separation from the bit line formed on the top layer.

The manufacturing method of our invention is suitable for flattening the steps existing between the memory cell array portions (e.g., portion MA to be discussed below) and the other portions (e.g., portion PC or word strap part WS to be discussed below) of a DRAM memory device. It is also applicable for flattening the steps existing within these other portions.

In this case, it is preferable to form an insulating layer (e.g., BPSG layer 66 to be discussed below) on the memory cell array portions and the other portions, and then flatten the steps between the memory cell array portions and these portions in a heat-treatment process after pre-annealing the insulation layer.

Also, it is preferable to form the insulating layer on the memory cell array portions and these other portions, to remove the insulating layer more on the memory cell array portion side than a given location on the slope forming a first step between the memory cell array portions and those portions by a prescribed thickness after pre-annealing the insulating layer, to remove the insulating layer on the side higher than a given location on the slope forming a second step existing on these other portions by just a prescribed thickness, and to eliminate the projecting parts existing on the side lower than the given location of the first and second steps with a heat-treatment process. Here also, the conditions for pre-annealing, heat treatment (reflow), and spin-coating can be identical to those described above.

Our invention can be applied to the formation of an insulating layer (e.g., a BPSG layer 66 to be discussed below) on a surface containing multiple gate electrode parts and the flattening of the steps existing between the multiple gate electrodes and sides of the gate electrode part by the treatment after pre-annealing the insulation layer in, for example, an ASIC (Application Specific IC: IC for specific application). Here, too, the conditions for the pre-annealing, reflow, and spin-coating can be identical to those described above.

Our invention can also flatten a layer (e.g., an insulating layer) having steps formed by wiring (e.g., metal wiring) by either of the two roughly classified methods in, for example, the ASIC. Thus, it is possible easily to manufacture a device having a complex deposited structure of three-dimensional multilayers with high reliability.

BRIEF DESCRIPTION OF THE DRAWINGS

FIG. 1 shows a main cross section (section along A—A in FIG. 9: same hereafter) showing one step in the manufacturing process of a DRAM according to the first embodiment of our invention.

FIG. 2 shows a main cross section of another processing step.

FIG. 9 is planar pattern diagram of the main part of the DRAM.

FIG. 10 shows a main cross section showing the flattened state according to the resist position in the manufacturing process.

FIG. 11 shows a main cross section similar to FIG. 10 when the resist position is changed.

FIG. 12 shows a main cross section similar to FIG. 10 when the resist position is changed.

FIG. 13 shows a main cross section showing one step of the manufacturing process of a DRAM according to the second embodiment of our invention.

FIG. 14 shows a main cross section of another processing step.

FIG. 15 shows a main cross section of another processing step.

FIG. 16 shows a main cross section of another processing step.

FIG. 17 shows a main cross section of another processing step.

FIG. 21 is a main cross section showing one step of the manufacturing process of a DRAM according to the fourth embodiment of our invention.

FIG. 22 shows a main cross section of another processing step.

FIG. 23 is a main cross section of another processing step.

FIG. 24 is a main cross section of another processing step.

FIG. 25 is a main cross section of another processing step.

FIG. 26 is a main cross section of another processing step.

FIG. 27 is a main cross section of another processing step.

FIG. 28 is a main cross section of another processing step.

FIG. 29 is a main cross section of yet another processing step.

FIG. 30 is a main cross section showing one step of the manufacturing process of a DRAM according to the fifth embodiment of our invention.

FIG. 31 is a main cross section showing one step of the manufacturing process of a DRAM according to the sixth embodiment of our invention.

FIG. 32 is a main cross section of another processing step.

FIG. 33 is a main cross section of another processing step.

FIG. 34 is a main cross section of another processing step.

FIG. 35 is a main cross section of another processing step.

FIG. 36 is a main cross section of another processing step.

FIG. 51 is a main cross section of another processing step.

FIG. 52 is a main cross section of another processing step.

FIG. 53 is a main cross section of another processing step.

FIG. 54 shows a main cross section of yet another processing step.

FIG. 55 is a main cross section showing one step of the manufacturing process of a DRAM according to a conventional example.

FIG. 56 shows a main cross section of another processing step.

FIG. 59 is a main cross section showing one step of the manufacturing process of a DRAM according to another conventional example.

FIG. 60 shows a main cross section of another processing step.

In the FIGS., 1 is a silicon substrate, 3, 23 a n$^+$-type source region, 4, 24 n$^+$-type drain regions, 6 a SiO$_2$ layer, 11 a polysilicon layer (storage node: bottom electrode), 13, 50 polysilicon layers, 15 a dielectric film, 16 polysilicon layer (plate electrode: top electrode), 20, 90 gate electrodes, 21, 121 represent local steps, 22 a global steps, 25, 32, 35, 35', 62, 62', 95, 95', 162, 162' steps, 35A, 62A, 95A, 162A slopes, 36, 66, 86 BPSG layers, 49 a contact hole, 66A, 66B, 86A, 166A, 166B represent projecting parts, 70, 80, 100, 370 photoresists, 70A, 80A, 100A resist pattern terminating parts, 166, 266, 186, 266, 368, 370 SiO$_2$ layers according to the plasma CVD method, 167, 369 organic SOG layers, 267 an inorganic SOG layer, 367, MW metal wiring, WL a word line, BL a bit line, M-CELL a memory cell, MA a memory cell array portion, cap a cell capacitor, PC a peripheral circuit portion, TR a transistor, PEB a patterned etchback, BPSG a borophosphorsilicate glass, and SOG is spin-on glass.

DETAILED DESCRIPTION

Figure 62:
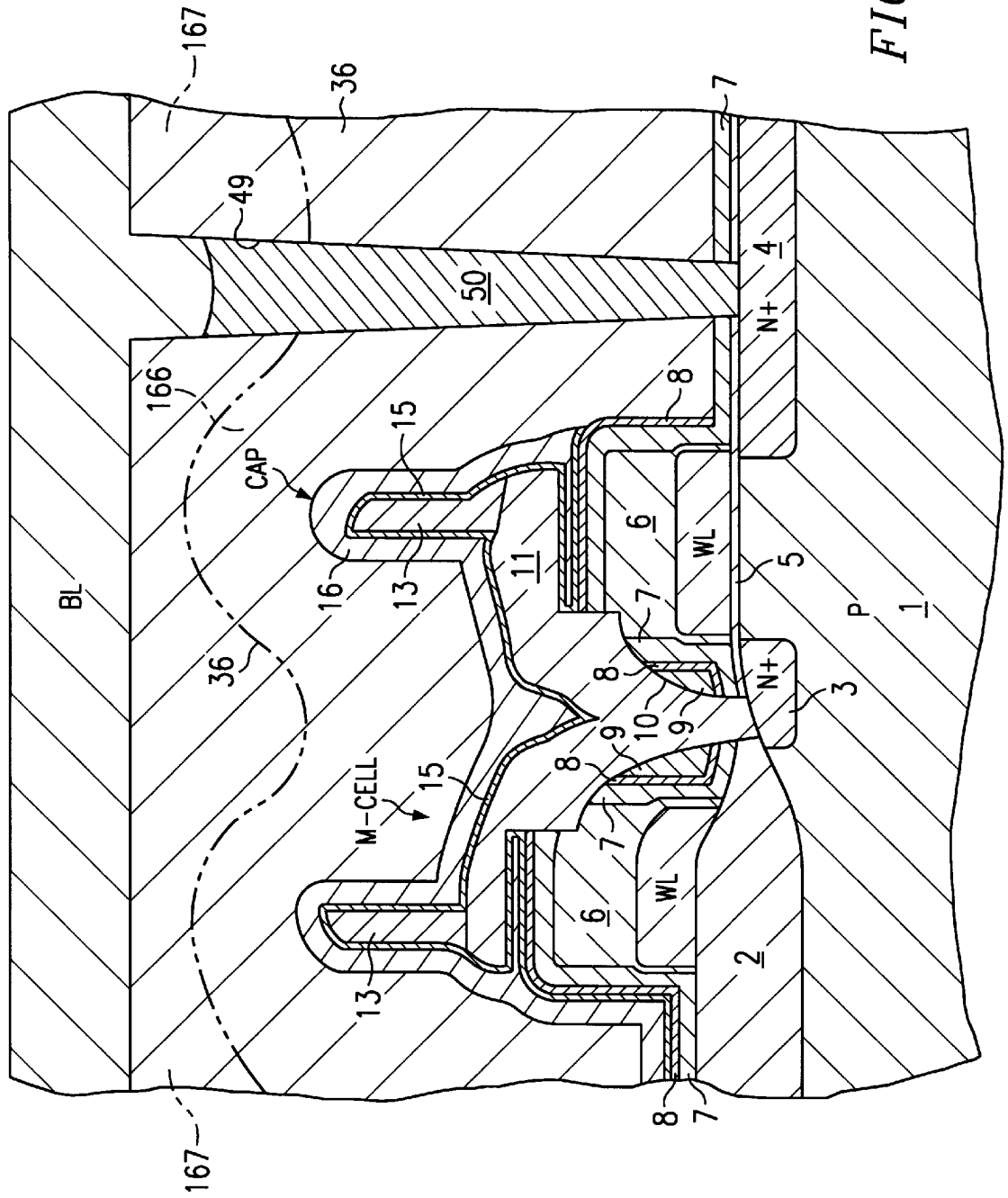
FIG. 62 is an enlarged cross section showing a conventional example of a DRAM.

FIGS. 1–12 show a first embodiment of our invention applied to a DRAM. FIG. 1 is a cross section along A—A in FIG. 9, which is an enlarged top view of one part of a DRAM having memory array portion MA and portion PC (same as the process discussed with reference to FIG. 55). On one principal surface of p-type silicon substrate 1, memory cells M-CELL (cell height about 1.2 μm, word line WL spacing about 0.4 μm, word line WL height about 3500 Å) with stacked-cell capacitor cap, as shown in FIG. 62, are formed in portion MA, and MOS transistors TR for bit line/sense amplifier separation composing the input/output circuit are formed in portion PC. These transistors TR are composed of a structure provided with polysilicon gate electrode 20 between n$^+$-type source region 23 and n$^+$-type drain region 24 via gate oxide film 5.

A BPSG layer 66 about 4 wt % boron and about 5 wt % phosphorus is deposited to a thickness of 1.0 μm over the entire surface of substrate 1 according to the CVD method, as shown in FIG. 2 (same as the process discussed with reference to FIG. 56). The thickness is made to be 1 μm in consideration of the etchback process (etching amount is 0.5 μm) to be discussed below.

On the surface of the deposited layer 66, memory cells M-CELL are formed in accordance with the height of cell capacitor cap, the thickness of word line WL, etc. and local step 21 is created in portion MA. However, a structure, such as the screen structure, does not exist in portion PC on the outside of the terminating part in portion MA (distance between gate electrode 20 and word line WL of the memory cell is about 4 μm) so that a global step 22 which is steeper than local step 21 is created between portion MA and portion PC.

Even in portion PC, step 25 is created on the sides of gate electrode 20 or between gate electrodes 20 and 20, but the height difference is less than global step 22 (however, it may indicate a height difference greater than or equal to local step 21).

Figure 3:
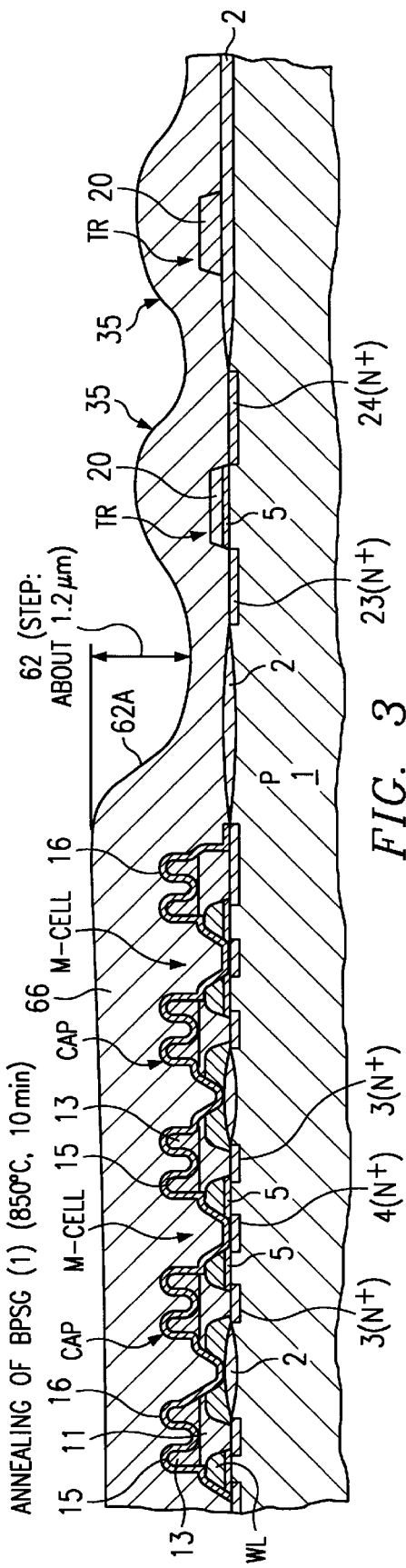
FIG. 3 shows a main cross section of another processing step.

Pre-annealing is executed in an $N_2$ atmosphere for 10 min at 850° C., the steps 21, 22, and 25 are leveled (smoothed), the BPSG layer is made fine and stable, as shown in FIG. 3. The condition for the pre-annealing is determined to suppress the thermal process to a minimum in consideration of the reflow process of the BPSG to be discussed below.

However, according to the pre-annealing, local step 21 is essentially eliminated, step 25 of peripheral part PC is smoothed, and the steepness of global step 22 is smoothed, but flattening in the vicinity of global step 22 of large height difference is difficult. That is, step 62 (this is also a global step) with height difference about 1.2 μm remains between portion MA and portion PC. This global step 62 is removed in the following way.

Figure 4:
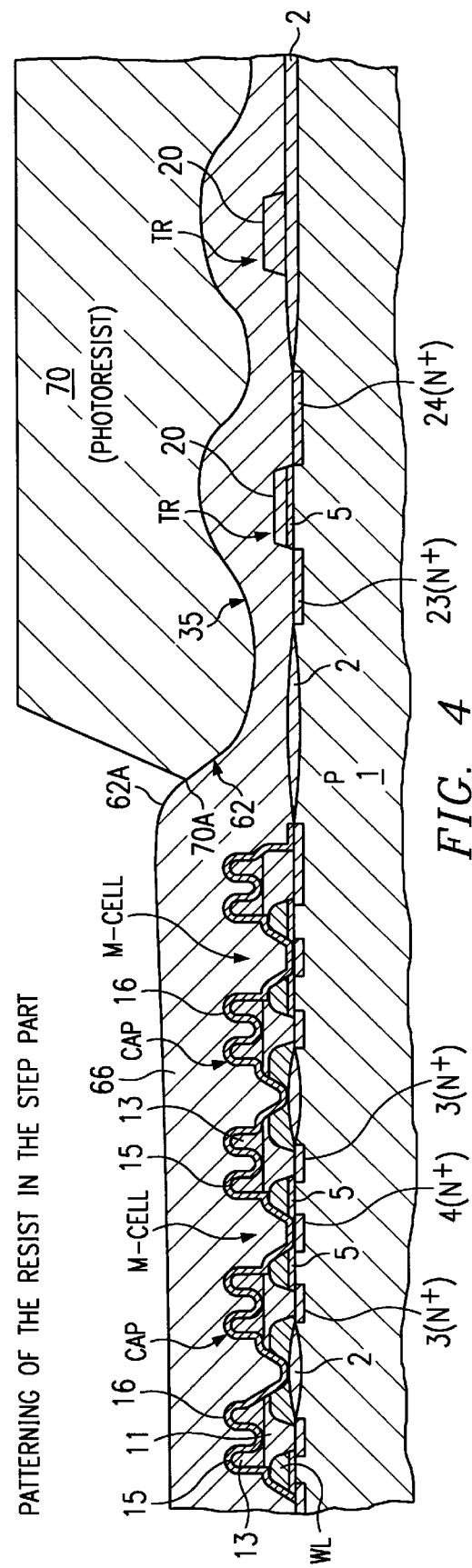
FIG. 4 shows a main cross section of another processing step.

First, photoresist 70 deposited over the entire surface of BPSG layer 66 is exposed to a prescribed pattern and developed, and photoresist 70 is patterned so that terminating part 70A is positioned in the middle at slope 62A of global step 62 between portion MA and portion PC, as shown in FIG. 4. The location of this terminating part 70A is shown in FIG. 9.

Figure 5:
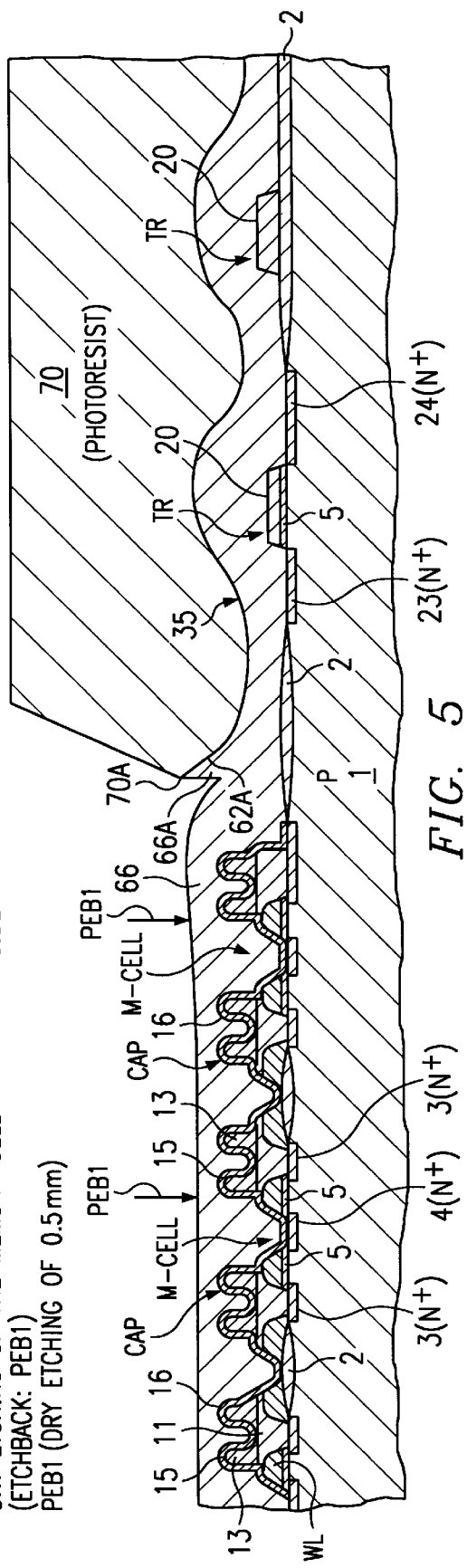
FIG. 5 shows a main cross section of another processing step.
Figure 6:
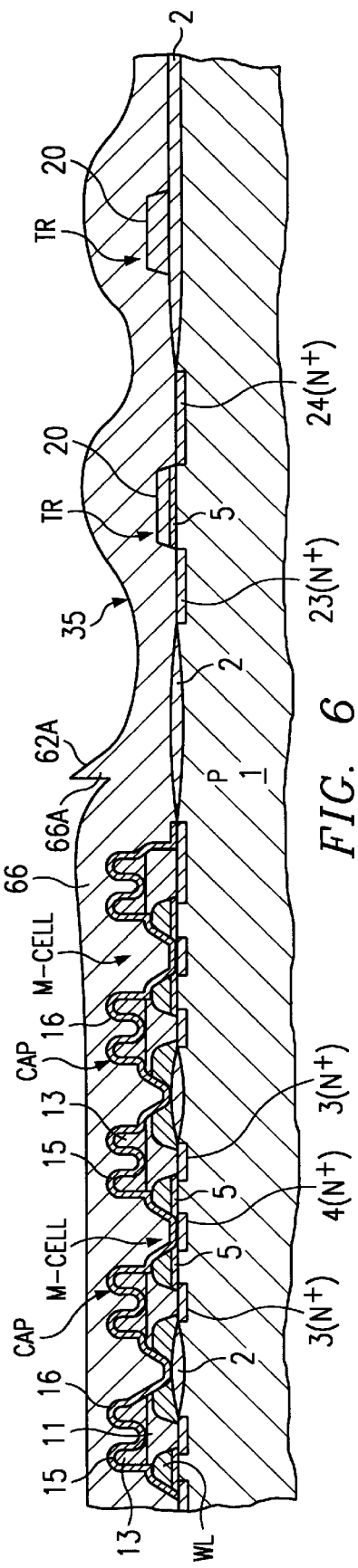
FIG. 6 shows a main cross section of another processing step.

The exposed part of BPSG layer 66 is uniformly etched back (this is abbreviated hereafter as PEB (pattern etchback)) more on the portion MA side than global step 62 (specifically, terminating part position of resist 70) by anisotropic dry etching with $CF_4$ gas, where photoresist 70 is used as a mask, as shown in FIG. 5. In this dry etching process, "PEB1," BPSG layer 66 is removed uniformly just by a thickness of 0.5 μm. Photoresist 70 is then removed from the entire surface. Thus, along with the thickness of BPSG layer 66 on portion MA being reduced to half as shown in FIG. 6, projecting part 66A formed in one part of slope 62a is left in the part where global step 62 was before. The height and volume of the projection part 66A are not too large.

Figure 7:
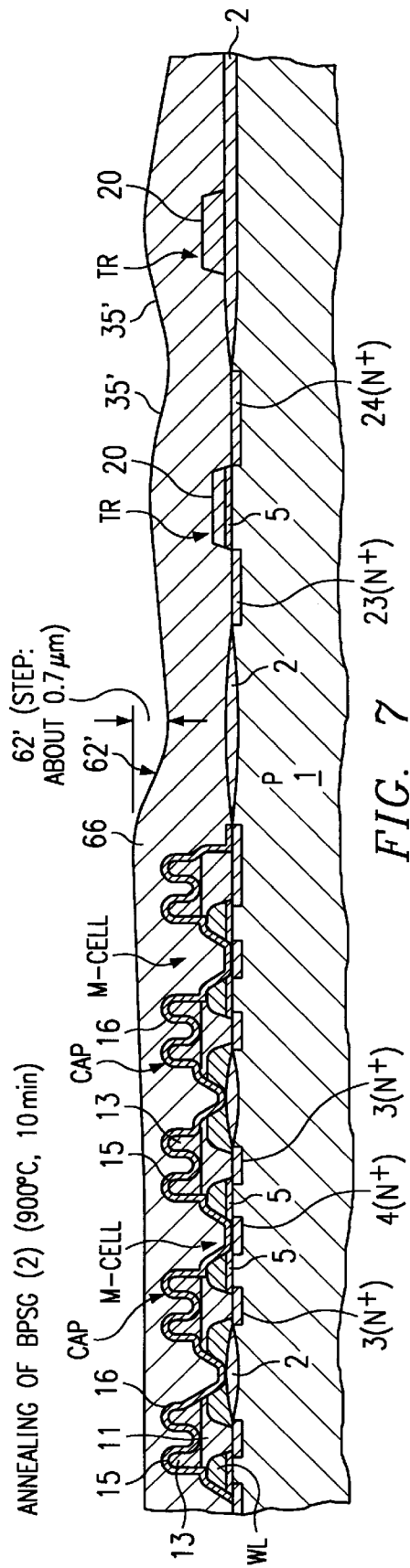
FIG. 7 shows a main cross section of another processing step.

Annealing is executed in a $N_2$ atmosphere for 10 min at 900° C. and a reflow process is executed on BPSG layer 66, as shown in FIG. 7. As a result, the projecting part 66A is made to flow, the step in the peripheral circuit portion is essentially eliminated, as indicated by 35', and although only small step 62' (e.g., about 0.7 μm, height difference is normally 0.3–0.8 μm) is left as a global step in the part global step 62 was before, this step 62' is very small, the surface of BPSG layer 66 is essentially flattened, so that there will not be a negative influence on the wiring (to be discussed below).

Figure 8:
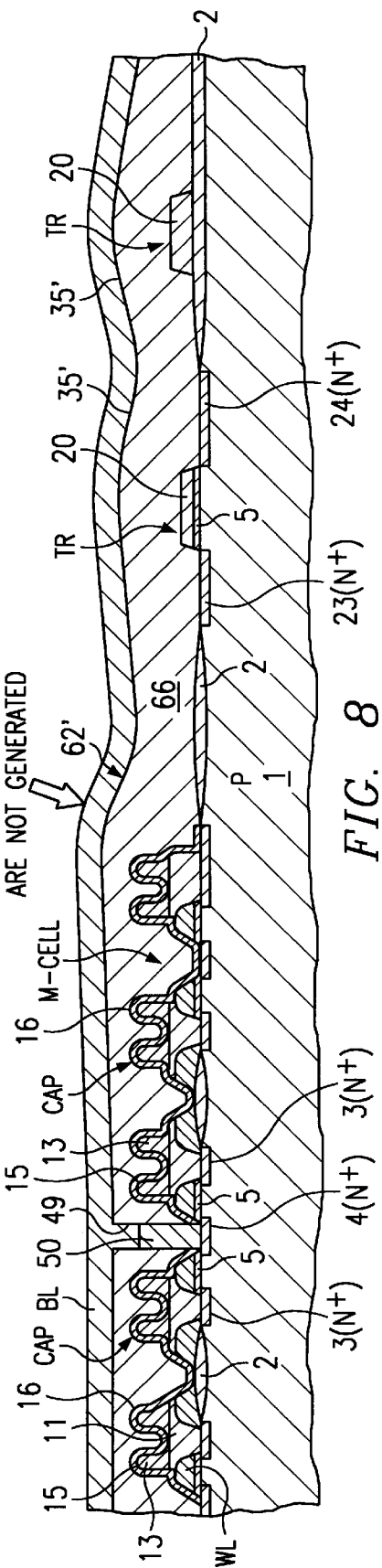
FIG. 8 shows a main cross section of yet another processing step.

A contact hole 49 is formed at the prescribed part of BPSG layer 66, polysilicon layer 50 is embedded here, and bit line BL is formed on BPSG layer 66 with a prescribed width and pitch as shown in FIG. 8.

In this case, the height difference of global step 62' becomes quite small, the step of portion PC also becomes smooth as indicated by 35', and the surface of BPSG layer 66 is generally essentially flat, so that processing, where photoresist is used as the mask during the patterning of bit line BL, can be executed with high precision, and short circuits and breaks are not generated between the bit lines.

The reason that such excellent results can be obtained is not simply due to reflow of the BPSG layer as in the conventional technology, as shown in FIGS. 55–58, but to the reflow process, as shown in FIG. 7, after removal of the part of the layer on the side higher than middle position 70A (photoresist terminating part) on slope 62A forming global step 62 by only the prescribed thickness with the PEB process after pre-annealing, as shown in FIGS. 2–6. Thus, the thickness of BPSG layer 66 and the height of step 66 are made to correspond to the amount of thickness removed, the reflow process can be executed with a small remaining projecting part 66A, where this projecting part 66A can be subsequently eliminated easily, and BPSG layer 66 can be sufficiently and reliably flattened.

Therefore, at the same time that the bit line BL (and other wiring) can be formed without breaks and short circuits, the photoresist can be exposed and patterned during wiring formation, so that multiple adjacent wiring can be formed with the prescribed width and interval (or pitch).

Consequently, processing of the wiring can be executed finely, with high precision, and with a wide tolerance. In particular, with strict design rules for minimal wiring width and spacing (e.g., less than 0.4 μm), when the tolerance for the focusing length for exposure during photolithography is otherwise not too large, it can now be increased significantly by flattening the global step. Also, the breaks at the step part due to electromigration of the aluminum wiring during use can be suppressed to a minimum.

Also, according to the present embodiment, flattening of global step 62 is executed simply by adding the necessary processes (processes in FIGS. 3–6) to the conventional technology, so that it is superior in that it is only necessary to add the required processes to the conventional process, new equipment need not be added, and so forth.

The influence of the pattern position on photoresist 70, shown in FIG. 4 and FIG. 5 of the aforementioned manufacturing process, will be explained with reference to FIGS. 10–12.

FIG. 10 represents the case where resist pattern terminating part 70A is located between the memory cell array region and peripheral circuit region (i.e., the position indicated on slope 62A of step 62), and PBSG layer 66 is etched back sufficiently according to PEB1, and the remaining projecting part 66A is small and narrow, so that remaining step 62' is short, about 0.7 μm. It is thus apparent that the surface can be sufficiently flattened in a reflow process. According to the design rules, the gate electrode of the peripheral circuit portion is to be from word line WL separated by 4 μm at the outermost end of the memory cell array portion (same hereafter).

On the other hand, FIG. 11 represents the case where resist pattern terminating part 70A is positioned within the memory cell array region, and although BPSG layer 66 of the memory cell array portion is etched back according to PEB1, step 62 is not etched. Therefore, a thick residual part 66A remains after PEB1. This residual part cannot be eliminated with a reflow process; a significantly considerably high step 62' about 1.0 μm would remain, and the effect is minimal compared to the example shown in FIG. 10.

Also, FIG. 12 represents the case where resist pattern terminating part 70A is positioned within the peripheral circuit region and resist pattern terminating part 70A is separated from step 62, so that BPSG layer 66 is simply etched back uniformly to include step 62 according to PEB1. Thus, step 62' about 1.0 μm remains even after a reflow process is executed, and the effect is minimal compared to the example shown in FIG. 11.

It is apparent from FIGS. 10–12 that it is necessary to form a pattern with which resist pattern terminating part 70A is present on slope 62A of step 62, as shown in FIG. 10, as a pattern of resist 70 during PEB1. However, there are no problems as long as the location of the resist pattern terminating part 70A is on slope 62A of step 62. It is preferable, however, that it have an average height corresponding to about ⅓ of the step height and that, for example, it be positioned so that it is separated by about 0.4 μm from the storage node (refer to FIG. 62) of the cell capacitor which is at the outermost end of the memory cell array portion (refer to FIG. 9).

It is possible to deposit another BPSG layer (not shown in the figure) on BPSG layer 66 to include the projecting part 66A to a thickness of, for example, 0.25 μm with a CVD process after the PEB process shown in FIG. 5 and FIG. 6, and then execute the reflow process shown in FIG. 7. Here as well, the surface of the BPSG layer can be made flat with the reflow process and the influence of the projection part 66A can be sufficiently removed during the flattening.

Also, it is possible to execute total surface wet etching of BPSG layer 66 according to, for example, buffered hydrofluoric acid (buffered hydrofluoric acid such as HF+NH$_4$F, etc.) after the reflow process shown in FIG. 7 and uniformly remove BPSG layer 66 by only a thickness of, for example, 0.25 μm. Thus, it is possible to reduce the film thickness of BPSG layer 66 and easily form contact hole 49 (refer to FIG. 8) during the subsequent formation of bit line BL.

FIGS. 13–17 show a second embodiment in which our invention is applied to a DRAM.

Into the present embodiment, each process prior to the process shown in FIG. 13 is implemented in the same manner as each process shown in FIGS. 1–5 (however, the thickness of BPSG layer 66 in FIGS. 1–4 is 1.2 μm and etching amount in PEB1 of FIG. 5 is 0.7 μm) with the added feature of a process for flattening step 35 of portion PC.

That is, photoresist 80 is again adhered after removing resist 70 and photoresist 80 is patterned so that each terminating part 80A is positioned on slope 35A of step 35 in portion PC, as shown in FIG. 13.

The exposed part of BPSG layer 66 on the side higher (gate electrode 20 side) than step 35 (specifically terminating part position of resist 80) is uniformly etched back with an anisotropic dry etching process with CF$_4$ gas, where photoresist 80 is used as a mask as shown FIG. 14. With this dry etching, referred to as "PEB2," BPSG layer 66 on gate electrode 20 is uniformly removed by a thickness of only 0.3 μm.

Thus, along with the ability to reduce the thickness of BPSG layer 66 on gate electrode 20, projecting part 66B formed by one part of slope 35A is left in the part where step 35 formerly existed, as shown in FIG. 15, when photoresist 80 was removed.

Annealing is then executed in an N$_2$ atmosphere for 10 min at 900° C. and a reflow process is executed on BPSG layer 66 as shown in FIG. 16. As a result, the projecting parts 66A and 66B are made to flow, and although only a small step 62' (for example, about 0.5 μm, where height difference is typically 0.3–0.8 μm) remains as a global step in the part where global step 62 formerly existed, this step 62' is very small, and step 35 of peripheral circuit portion is essentially completely eliminated as indicated by 35'. Also, the surface of BPSG layer 66 is essentially flattened, and will not influence the wiring (to be discussed below).

A contact hole 49 is formed at the prescribed part of BPSG layer 66, polysilicon layer 50 is embedded here, and bit line BL is formed on BPSG layer 66 to a prescribed width and pitch, as shown in FIG. 17.

In this case, the height difference of global step 62' is small, the step of portion PC is almost completely eliminated as indicated by 35', and the surface of BPSG layer 66 is essentially generally flat, so that processing of the photoresist which acts at the mask during the patterning of bit line BL can be executed with high precision and so that no breaks and short circuits between the bit lines are generated. In addition, superior effects similar to those of the aforementioned first embodiment are obtained.

In the present embodiment, as shown in FIGS. 13–16, in addition to global step 62 between portion MA and portion PC, step 35 in portion PC is also subjected to PEB2 and reflow processes, and it is thus essentially completely eliminated so the surface of BPSG layer 66 can be flattened even more relative to the first embodiment.

Figure 18:
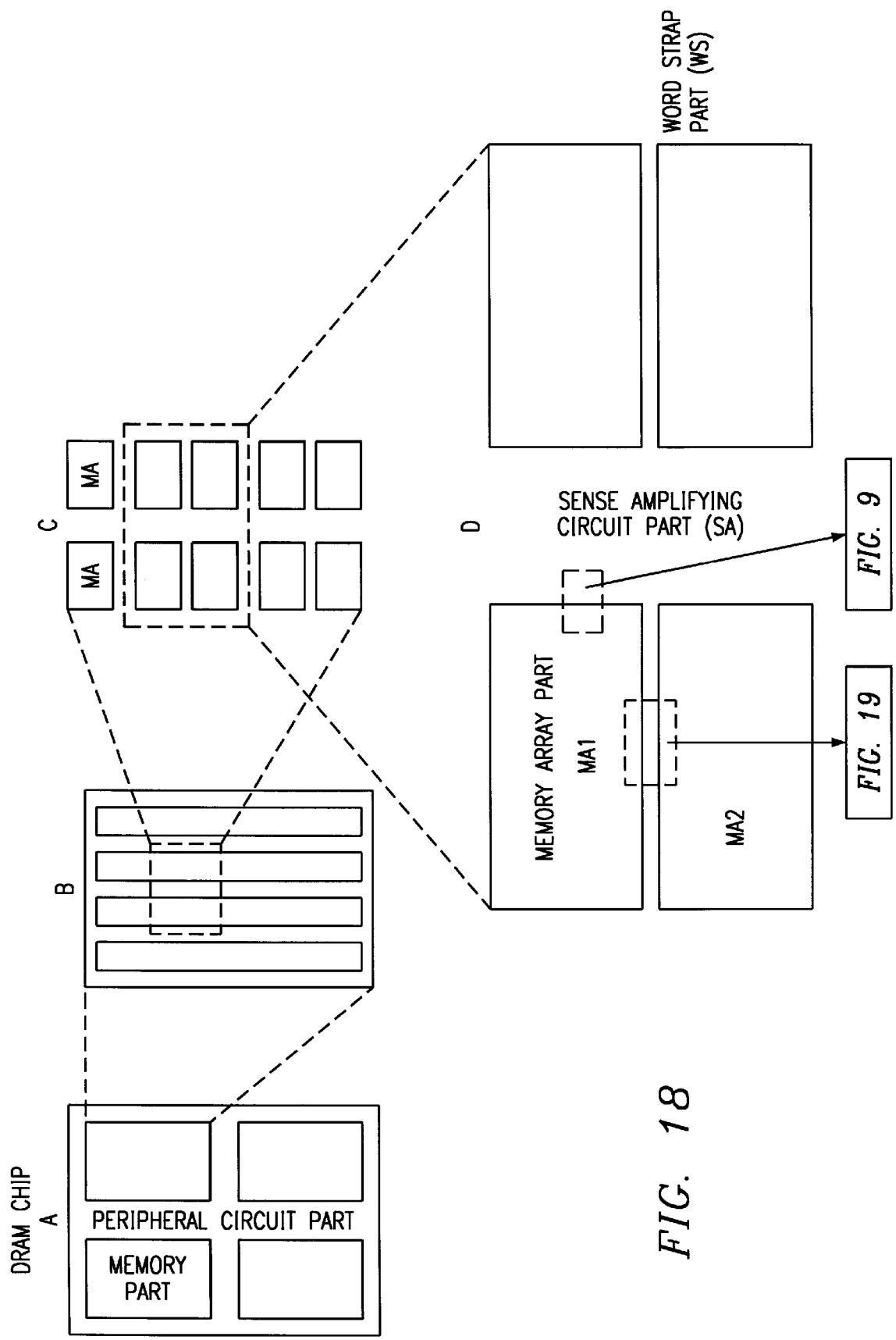
FIG. 18 is a schematic diagram showing the layout of a DRAM according to a third embodiment of our invention.
Figure 19:
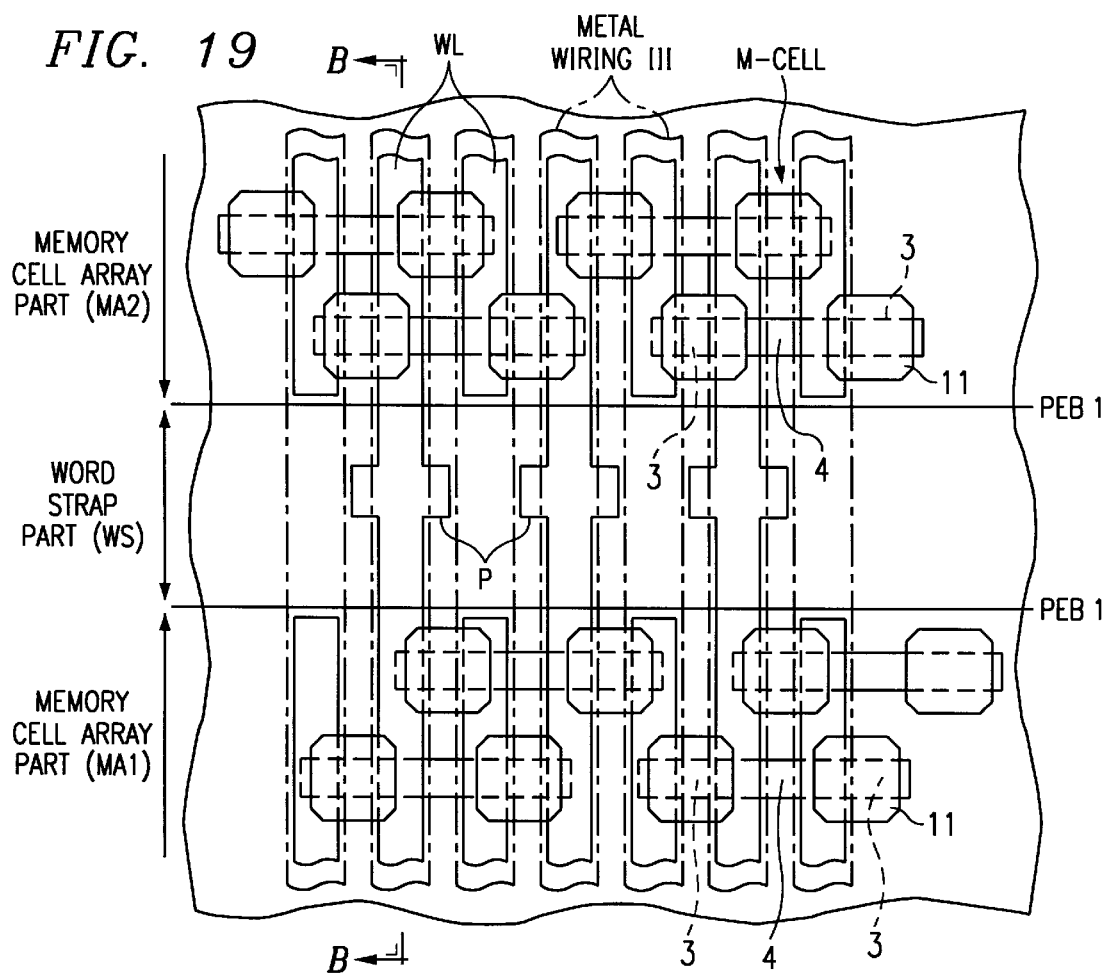
FIG. 19 is a planar pattern diagram of the main part of the DRAM.
Figure 20:
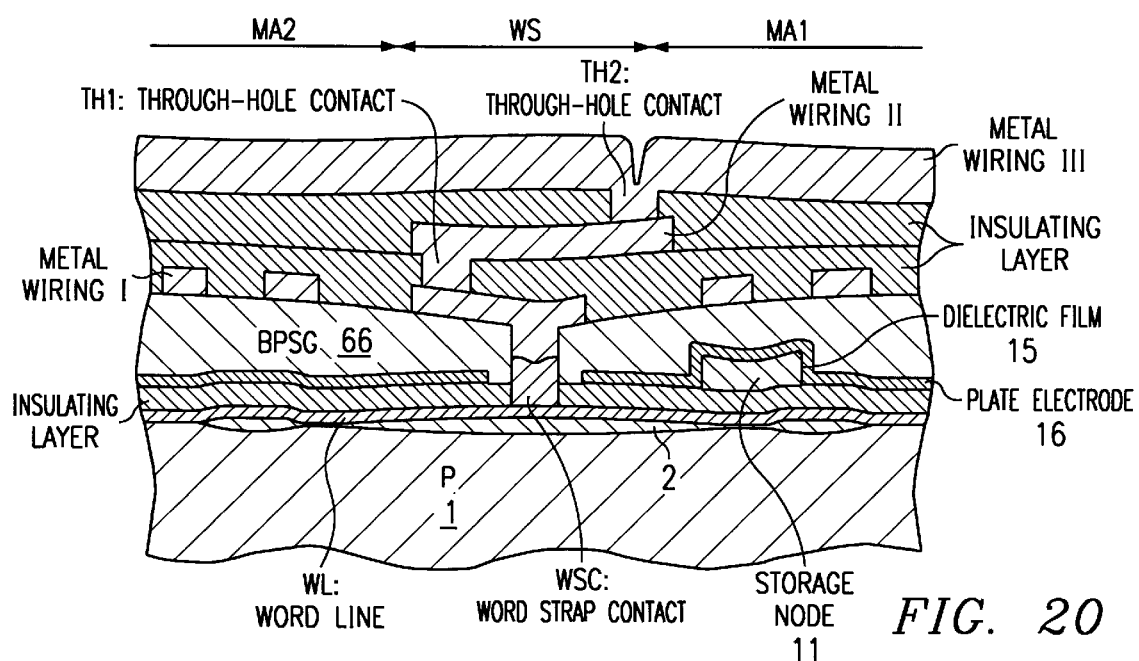
FIG. 20 is a cross section along B—B in FIG. 19.

FIGS. 18–20 show a third embodiment in which our invention is applied to a DRAM.

FIG. 18 shows the chip layout of the complete 64 Mb DRAM device. In FIG. 18, DRAM chip (A) indicates the layout of the entire chip, and B and C to the right of the figure indicates smaller portions thereof, with the smallest structure indicated by D. A partially enlarged layout diagram of word strap part WS and memory array portion MA in D is shown in FIG. 19. A partially enlarged layout diagram of sense amplifying circuit portion SA and memory array portion MA is shown in FIG. 9.

Word strap part WS is connected to memory array portions MA1 and MA2, as shown in FIG. 19, or between other memory array portions as indicated by (C) and (D) in FIG. 18. Word strap part WS is an element with a metal wiring backing used to reduce the resistance of the word; specifically, the word line is alternately extended to the metal wiring at the uppermost part by a through-hole every 64 bits.

A detailed top view of each word line WL pattern formation with respect to word strap part (W) would be too complicated; it is therefore shown in a simplified form in FIG. 19. FIG. 20 is a cross section along B—B of memory array portions MA1 and MA2 and word strap part WS. Center convex part (P) of word line WL in FIG. 19 is the part for providing word strap contact WSC.

That is, a structure is shown wherein metal wiring (III) of the uppermost layer, indicated by the segmented line in FIG. 19, is connected via through-hole contact TH2 to metal wiring (II) which in turn is connected to metal wiring (I) via through-hole contact TH1 which in turn is connected to word line WL of the lowermost layer in FIG. 20 via word strap contact WSC. Control signals are input to each word line from metal wiring (III). Each contact is made via an insulation layer such as BPSG layer 66, etc. Then a step is formed along the line indicated by PEB1 in FIG. 19.

However, by executing the same processes discussed in relation to FIGS. 1–8 in order to flatten the step, it is possible to flatten the step between portion MA and word strap part WS.

In this flattening process, the word strap part does not have a storage node, so that the height difference (step) between the memory cell array portion is about 0.65 $\mu$m, but by executing the PEB process as described above, the height difference can be reduced to about 0.2 $\mu$m, which has been verified.

FIGS. 21–29 represent a fourth embodiment in which our invention indicated is applied to a DRAM; they are the primary cross-sectional figures which indicate the processing steps, the same as those of FIGS. 1–8 in the first embodiment.

In this embodiment, the insulating layer formed on the peripheral circuit portion and memory cell array portion is formed according to the plasma CVD method, and the surface irregularities formed on this insulation layer are flattened according to spin-coating of an organic SOG to make the local and global steps small. The remaining processing steps are the same as those of the first embodiment explained in relation to FIGS. 1–12.

First, insulating layer (SiO$_2$ layer) 166 shown in FIG. 22 is deposited to a thickness of 1.0 $\mu$m according to the plasma CVD method in over the entire surface of silicon substrate 1 shown in FIG. 21 provided with portion MA and portion PC. The plasma CVD parameters are Temperature: approximately 350° C.
Gas: TEOS+O$_2$
Power: 480 W
Pressure: 9.0 torr On the surface of insulating layer 166, convex parts according to local steps 21 and 25 are formed in the area of portion MA and portion PC, and global step 162 is formed in the interface between regions MA and PC.

The photoresist 70 deposited over the entire surface of insulating layer (SiO$_2$ layer) 166 is exposed according to the prescribed pattern shown in FIG. 23 and developed. Photoresist 70 is patterned so that terminating part 70A is positioned in the middle position at slope 162A of global step 162 between portion MA and portion PC.

The exposed part of SiO$_2$ layer 166 is uniformly etched back PEB more on the portion MA side than the global step 162 side (specifically, the terminating part position of resist 70) with an anisotropic dry etching process with CF$_4$ gas, where photoresist 70 is used as a mask, as shown in FIG. 24. With this dry etching process, referred to as "PEB1," SiO$_2$ layer 166 is uniformly removed by a thickness of 0.5 $\mu$m.

Thus, besides reducing the thickness of Sio$_2$ layer 166 on portion MA by approximately one-half, projecting part 166A formed with one part of slope 162A remains at the part where global step 162 existed formerly, as shown in FIG. 25, when the photoresist 70 was removed. The height and volume of this projecting part 166A are not too large.

SOG 167 is spin-coated on SiO$_2$ layer 166 to a thickness of 0.32 $\mu$m; it is then cured and solidified at 450° C. as shown in FIG. 26. The conditions for spin coating and the composition of SOG are as follows.

Composition of SOG: Organic material with —Si—O—CH$_3$ as a unit
Coated at: 3000–4500 rpm
Baked at: 100°–350° C., 5–10 min
Cured at: 400°–450° C., 30–60 min The convex part of local step 121 in portion MA becomes embedded and flattened in the SOG spin-coating process and besides the concave part of local step 25 in portion PC becoming essentially flat, projection part 166A is embedded in SOG 167 and the slope of global step 162' is reduced. Step 162' thus formed is about 0.7 $\mu$m, the surface of SOG layer 167 is essentially flattened, and thus will not influence the wiring (to be discussed below).

SOG layer 167 is etched back and SOG 167 is left only in the part of global step 22 and local step 121, as shown in FIG. 27.

SiO$_2$ layer 266 is formed on the surface according to the plasma CVD method as shown in FIG. 28.

A contact hole 49 is formed at the prescribed part of SiO$_2$ layers 166 and 266 (and the partially remaining SOG layer 167), polysilicon layer 50 is embedded, and bit line BL is formed to the prescribed width and pitch on SiO$_2$ layer 266, as shown in FIG. 29.

In this case, global step 162' has a small height difference, the step of portion PC becomes smoother as indicated with 135', and the surface of SiO$_2$ layer 266 is essentially completely flat, so that the processing of the photoresist which acts the mask during the patterning of bit line BL can be executed with high precision and short circuits and breaks between the bit line are not generated.

Figure 61:
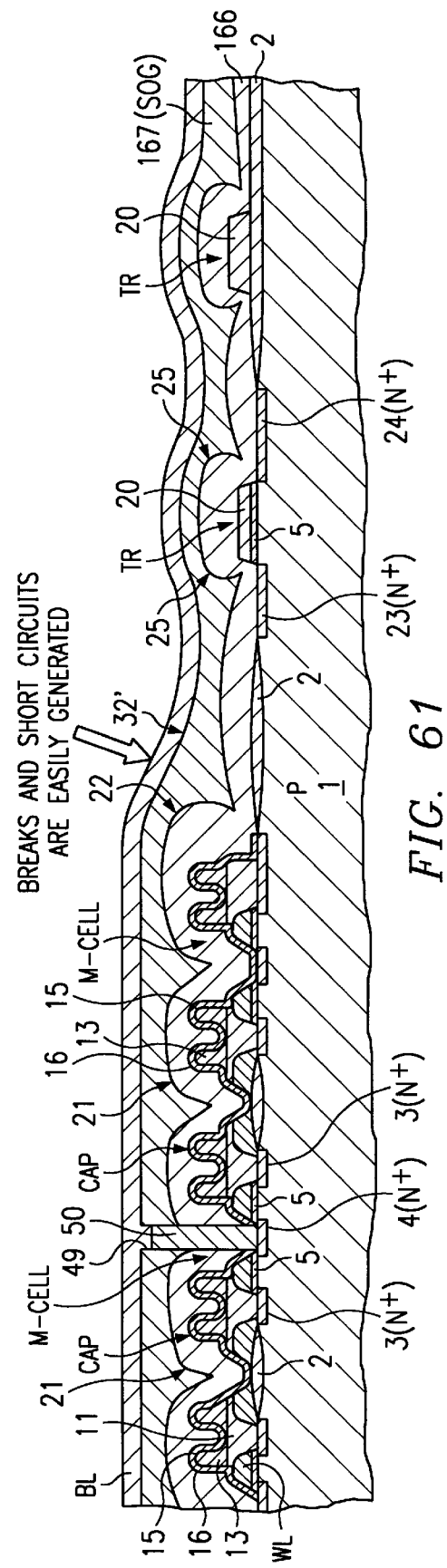
FIG. 61 is a main cross section showing yet another processing step.

This superior effect is not simply due to spin-coating the SOG layer as in the conventional technology shown in FIGS. 59–61, but to the fact that spin-coating of SOG is executed as shown in FIG. 26 after removing the layer part on the side higher than middle position 70A (photoresist terminating part) on slope 162A forming global step 162 by a prescribed thickness according to the PEB process as shown in FIGS. 22–24. Therefore, it is possible to make the thickness of SiO$_2$ layer 166 and height of the step correspond to the thickness removed. Also, spin-coating can be executed with the residual projecting part 166A low, the height difference between the high and low parts of SOG layer 167 can be made small, the projecting part 0166A can be easily in SOG layer, and SOG layer 167 can be sufficiently and reliably flattened.

Therefore, at the same time that bit line BL (as well as other wirings layers) can be formed without breaks and short circuits it is possible to expose the photoresist in accordance with the design pattern when the wiring is formed, so that multiple adjacent wiring can be formed to the prescribed width and spacing (or pitch).

Thus, it is possible to precisely process fine, high-density wiring with a wide tolerance. In particular, with strict design rules for minimal wiring width or spacing (e.g., less than 0.4 $\mu$m), the tolerance for the focusing length of the exposure during photolithography cannot otherwise be too large, but a greater tolerance can now be realized by flattening the global steps according to the present embodiment. Also, the complexity of the structure of the memory and the step height of the DRAM are expected to increase in the future, but even if the global steps between the memory cell array portion and the peripheral circuit becoming correspondingly larger, flattening of the surface will be possible.

According to this embodiment, in addition to the advantages, there are advantages such as the formation of SiO$_2$ layers 166 and 266 with the plasma CVD method, which makes film formation at a low temperature of 300°–400° C. possible. Also, films formed with the plasma CVD method do not require thermal reflow processes, so that there is no concern that the elements already formed will be damaged by heat, etc. Also, the diffusion region between the layers does not expand since heat treatment is not executed. Furthermore, there are the advantages that spin-coating of the SOG for flattening can be executed rapidly and that the smoothness of the surface will be ensured.

When an organic SOG is used as in this embodiment, there are the advantages that the composition can be easily adjusted and that the viscosity during spin-coating can be easily controlled by using a solvent.

FIG. 30 shows a fifth embodiment in which our invention is applied to a DRAM.

In this embodiment, inorganic SOG (inorganic material with —Si—O—H as a unit) 267 is used instead of organic SOG 167 in the fourth embodiment. Inorganic SOG layer can be made thinner than the organic SOG layer, and an etchback process is not necessary. Therefore, $SiO_2$ layer 266 is formed on SOG layer 267 with the plasma CVD method. The etching amount according to PEB1 in FIG. 24 is 0.7 μm.

FIGS. 31–37 show a sixth embodiment in which our invention is applied to a DRAM.

In this embodiment, each process prior to the process shown in FIG. 31 is implemented in the same manner as each process shown in FIGS. 21–24 (however, the thickness of $SiO_2$ layer 166 in FIG. 34 is 1.2 μm and the etching amount according to PEB1 of FIG. 24 is 0.7 μm). However, here a process for flattening step 25 of portion PC is an added feature.

That is, photoresist 80 is again adhered after resist 70 is removed and photoresist 80 is patterned so that each terminating part 80A is positioned on slope 25A of step 25 in portion PC, as shown in FIG. 31.

The exposed part of $SiO_2$ layer 166 on the side (gate electrode 20 side) higher than step 25 (specifically, terminating part position of resist 80) is uniformly etched back by dry etching with $CF_4$ gas, where photoresist 80 is used as a mask as shown in FIG. 32. With this dry etching process, referred to as "PEB2," $SiO_2$ layer 166 on gate electrode 20 is uniformly removed by a thickness of 0.3 μm.

Thus, along with reducing the thickness of $SiO_2$ layer 166 on gate electrode (20, projecting part 166B formed in one part of slope 25A remains in the part where step 25 formerly existed as shown in FIG. 33, after photoresist 80 was removed. The height and volume of this projecting part 166B are quite small.

Organic SOG 167 is spin-coated to a thickness of 0.3 μm on $SiO_2$ layer 166 and then cured and solidified at 450° C., as shown in FIG. 34. The conditions for spin-coating and the composition of the SOG are the same as those in the fourth embodiment.

The concave part and projecting part 166A on local step 121 in portion MA are embedded in SOG 167 according to SOG spin-coating, and the surface of portion MA becomes flat. The concave part and projecting part 166B on local step 25 in portion PC are also embedded in SOG 167, and the surface of portion PC also becomes flat. In addition, global step 162' of SOG layer 167 becomes small 0.5 μm the part where global step 162 formerly existed, the slope becomes smooth, and the surface of SOG layer 166 is essentially flattened, so as not to influence the wiring (to be discussed below).

SOG layer 167 is etched back and SOG layer 167 remains only in one part of global step 22 and local step 121, as shown in FIG. 35.

$SiO_2$ layer 266 is formed on the surface according to the plasma CVD method as shown in FIG. 36.

Figure 37:
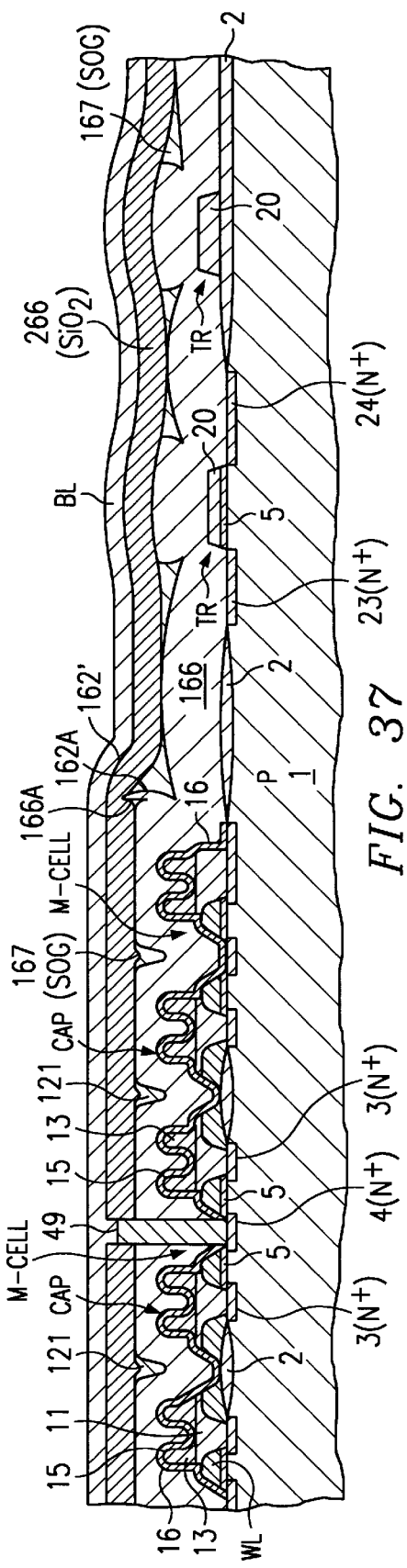
FIG. 37 is a main cross section of yet another processing step.

A contact hole 49 is formed at the prescribed part of $SiO_2$ layers 166 and 266 (and partially remaining SOG layer 167), polysilicon layer 50 is embedded therein, and bit line BL is formed on $Sio_2$ layer 266 to the prescribed width and pitch as shown in FIG. 37.

According to this embodiment, the same effects those of the fourth embodiment are obtained. In addition, the surface of SOG layer 167 in portion PC becomes flat and the reliability of the wiring above it (bit line BL) is further improved.

The spin-coating of SOG and the $SiO_2$ layer deposition with the plasma CVD method in this embodiment and the fourth and fifth embodiments are applicable to the structure of memory cell array portions MA1, MA2, and word strap part WS positioned between them according to the third embodiment explained previously in relation to FIGS. 18–20.

Figure 38:
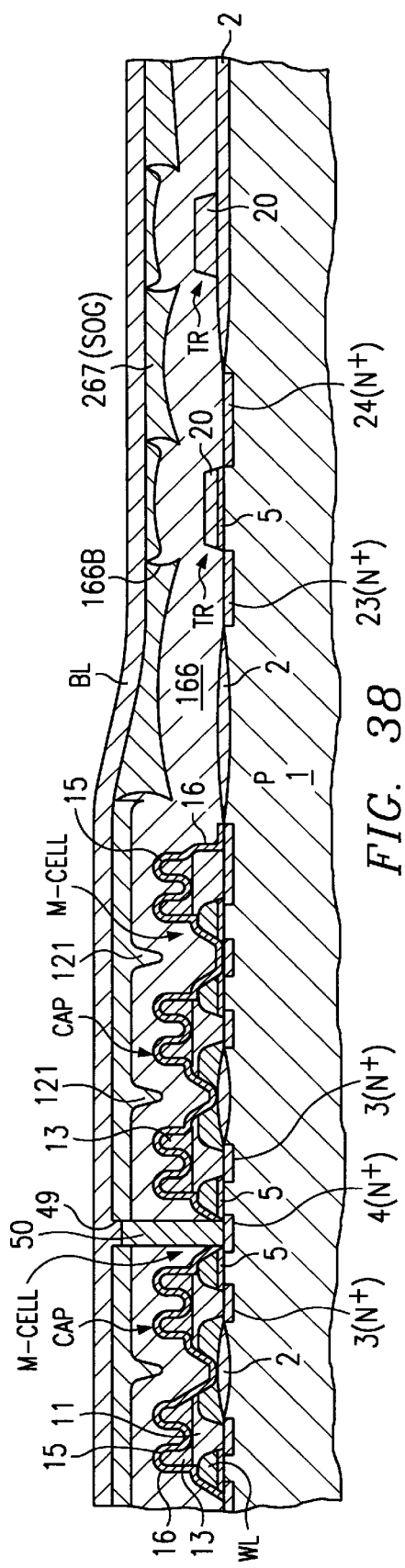
FIG. 38 is a main cross section showing one step of the manufacturing process of a DRAM according to the seventh embodiment of our invention.

FIG. 38 shows a seventh embodiment in which our invention is applied to a DRAM.

In this embodiment, inorganic SOG 267 is used instead of organic SOG 167 of the sixth embodiment. Inorganic SOG layer can be formed more thinly than organic SOG layer and an etchback process is not necessary. Therefore, $SiO_2$ layer 266 is formed on SOG layer 267 with the plasma CVD method. The etching amount according to PEB1 in FIG. 24 is 0.7 μm.

FIGS. 39–46 show an eighth embodiment in which our invention is applied to an ASIC (application specific IC).

Figure 39:
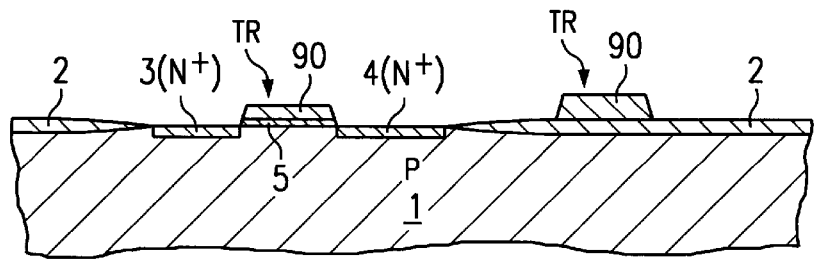
FIG. 39 is a main cross section showing one step of the manufacturing process of a DRAM according to the eighth embodiment of our invention.

In this embodiment, polysilicon gate electrode 90 is first formed on P-type silicon substrate 1 to the prescribed width and intervals, as shown in FIG. 39, in order to reduce the step between the gate electrodes of the ASIC. 2, 3, 4, and 5 in the figure represent the field oxide film, $n^+$-type source region, $n^+$-type drain region, and the gate oxide film, respectively.

Figure 40:
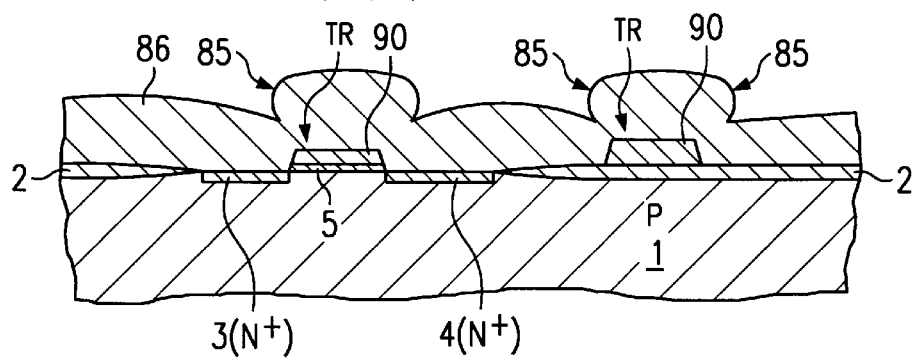
FIG. 40 shows a main cross section of another processing step.

BPSG layer 86 about 4 wt % boron and abut 5 wt % phosphorus is deposited to a thickness of 1.2 μm over the entire surface of substrate 1 with the CVD method, as shown in FIG. 40. The thickness of 1.2 μm is selected in consideration of the etchback process (etching amount is 0.5 μm) to be discussed below. Step 85 is formed on the sides of gate electrode 90 in accordance with the thickness of gate electrode 90, etc., at the surface of this deposition layer 86.

Figure 41:
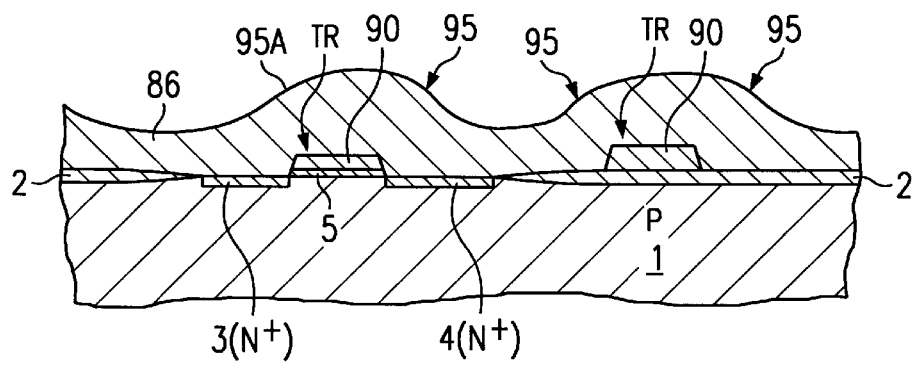
FIG. 41 is a main cross section of another processing step.

Pre-annealing is executed in an $N_2$ atmosphere for 10 min at 850° C., and the steps 85 and 95 are made leveled (smoothed), as shown in FIG. 41. The conditions for the aforementioned pre-annealing were determined in order to suppress the thermal process to a minimum in consideration of the BPSG reflow process (to be discussed below).

Figure 42:
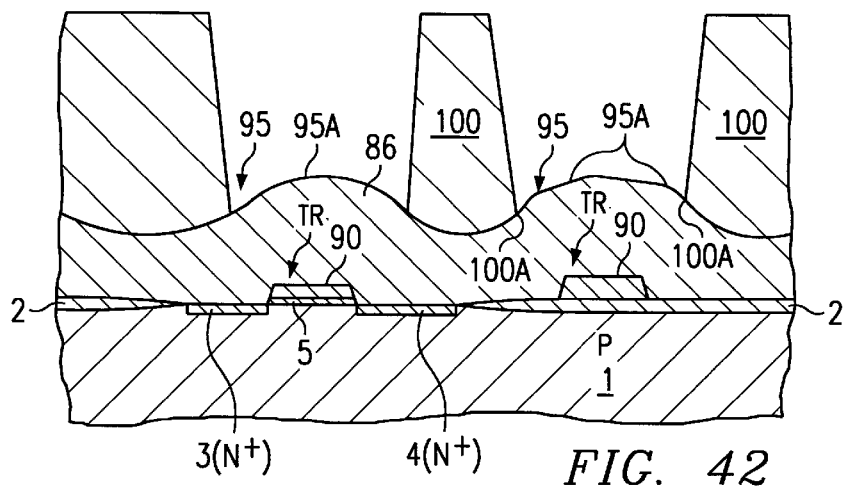
FIG. 42 is a main cross section of another processing step.

Photoresist 100 deposited over the entire surface is exposed to the prescribed pattern and developed. Photoresist 100 is patterned so that terminating part 100A will be positioned in the middle of slope 95A of step 95, as shown in FIG. 42.

Figure 43:
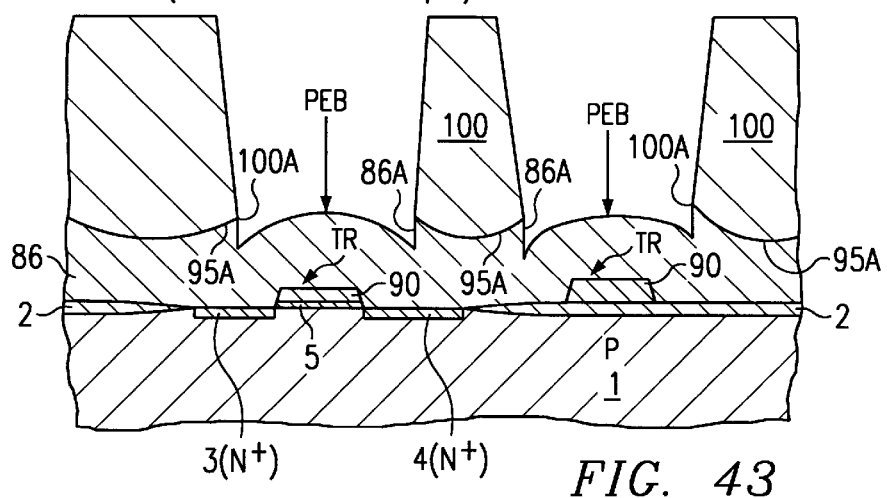
FIG. 43 is a main cross section of another processing step.

The exposed part of BPSG layer 86 on the side higher than step 95 (specifically, terminating part position of resist 100) is uniformly etched back PEB with an anisotropic dry etching process with $CF_4$ gas, where photoresist (100) acts as a mask. BPSG layer 86 is uniformly removed by a thickness of 0.3 μm, as shown in FIG. 43.

Figure 44:
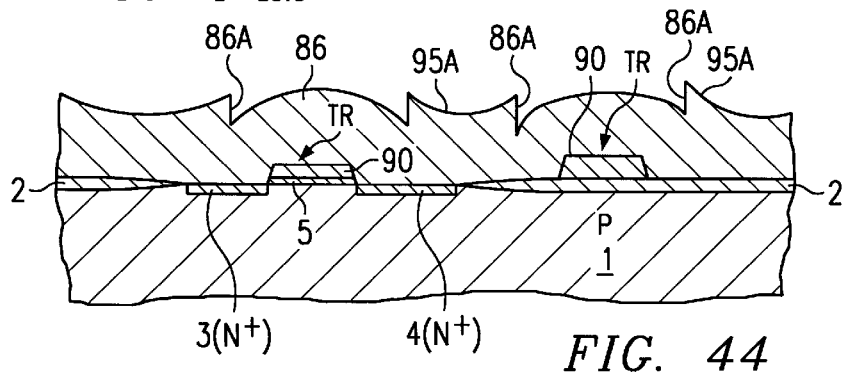
FIG. 44 is a main cross section of another processing step.

Thus, projecting part 86A formed with one part of slope 95A remains in the part where step 95 formerly existed, as shown in FIG. 44, after photoresist 100 was removed. The height and volume of this projecting part 86A are not too large.

Figure 45:
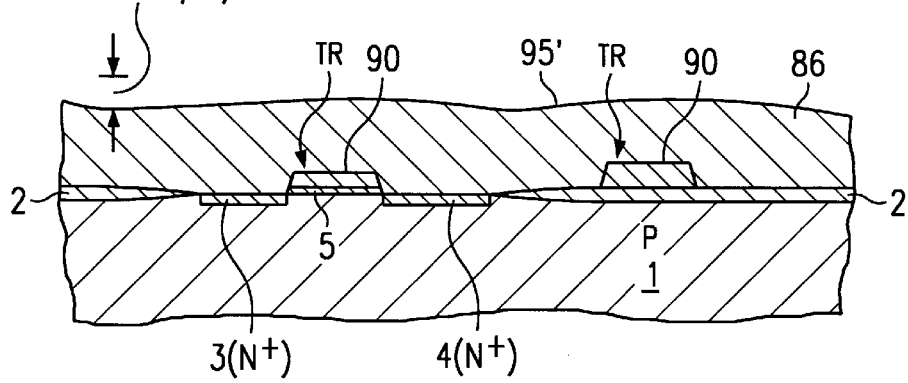
FIG. 45 is a main cross section of another processing step.

Annealing is performed in an $N_2$ atmosphere for 10 min at 900° C. and BPSG layer 86 is subjected to a reflow process, as shown in FIG. 45. As a result, the projecting part 86A is made to flow, and although only a small step (for example, about 0.5 μm, where the height difference is typically 0.3–0.8 μm) 95' remains in the part where step 95 formerly existed, this step 95' is very small, and the surface of BPSG layer 86 is essentially flattened, so as not influence the wiring to be discussed below.

Figure 46:
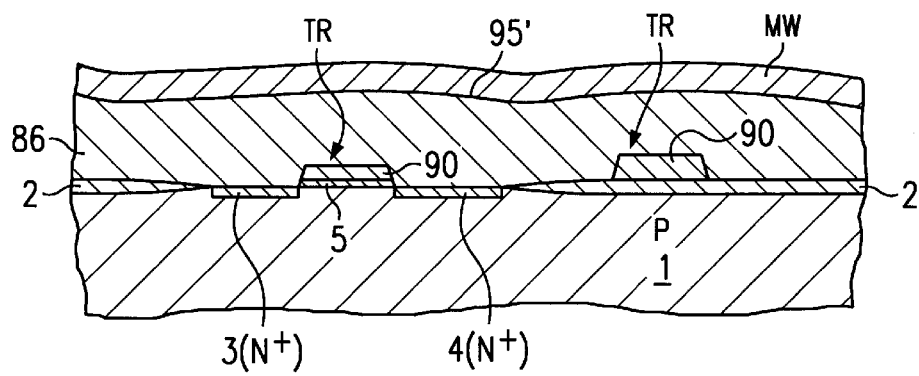
FIG. 46 shows a main cross section of yet another processing step.

Metal wiring MW is formed on BPSG layer 86 to the prescribed width and pitch, as shown in FIG. 46.

In this case, the height difference of step 95' is quite small and the surface of BPSG layer 86 is essentially completely flat, so that the processing of the photoresist, which acts as the mask during the patterning of metal wiring MW, can be executed with high precision, and short circuits and breaks in the metal wiring are not generated. In addition, the excellent effects similar to those of the first embodiment are obtained.

FIGS. 47–54 show a ninth embodiment in which our invention is applied to an ASIC. These figures represent a procedure for forming an insulating layer on a metal wiring layer and for flattening the step formed on the insulation layer surface accordance with the metal wiring. In these figures, only the metal wiring elements are shown; the elements on the bottom layer have been omitted.

Figure 47:
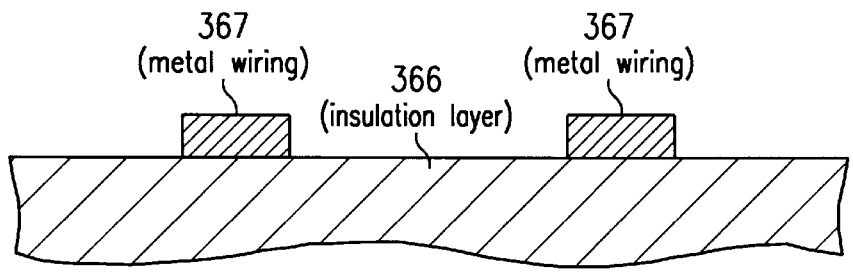
FIG. 47 is a main cross section showing one step of the manufacturing process of a DRAM according to the ninth embodiment of our invention.

FIG. 47 is a cross section of metal wiring 367 formed on insulating layer 366.

Figure 48:
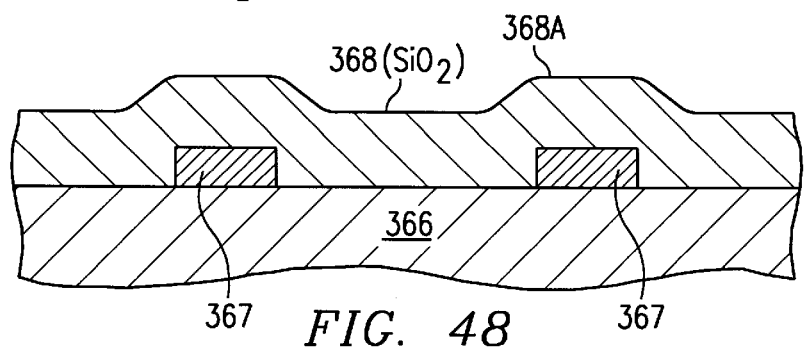
FIG. 48 shows a main cross section of another processing step.

First, $SiO_2$ layer 368 is deposited over the entire surface of insulating layer 366 formed on metal wiring 367 in accordance with the plasma CVD method to a thickness of 1.0 $\mu$m, as shown in FIG. 48. This thickness of 1.0 $\mu$m was selected in consideration of the etchback process (etching amount is 0.3 $\mu$m) to be discussed below. Convex part 368A is formed on metal wiring 367 in $Sio_2$ layer 368.

Figure 49:
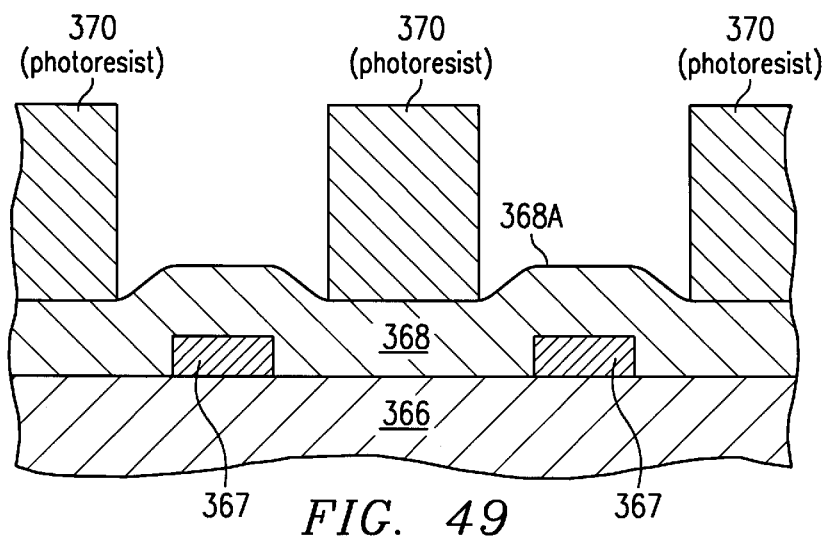
FIG. 49 is a main cross section of another processing step.

Photoresist is formed on $SiO_2$ layer 368 and is patterned as shown in FIG. 49 by exposure and development. Photoresist 370 is patterned to remain between convex parts 368A of the $SiO_2$ layer.

Figure 50:
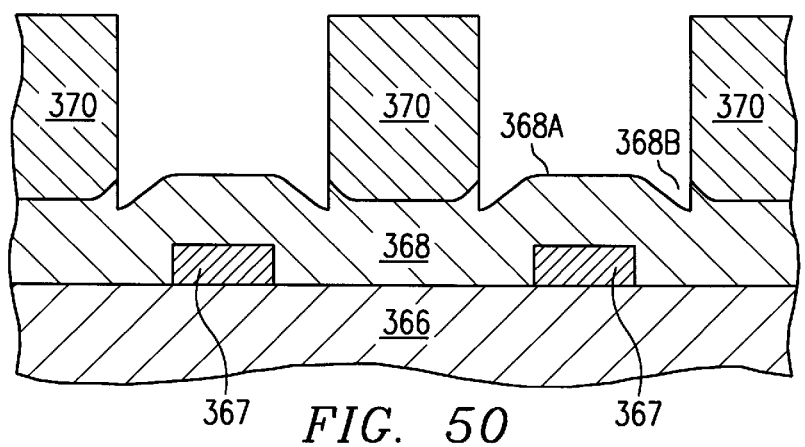
FIG. 50 is a main cross section of another processing step.
Figure 57:
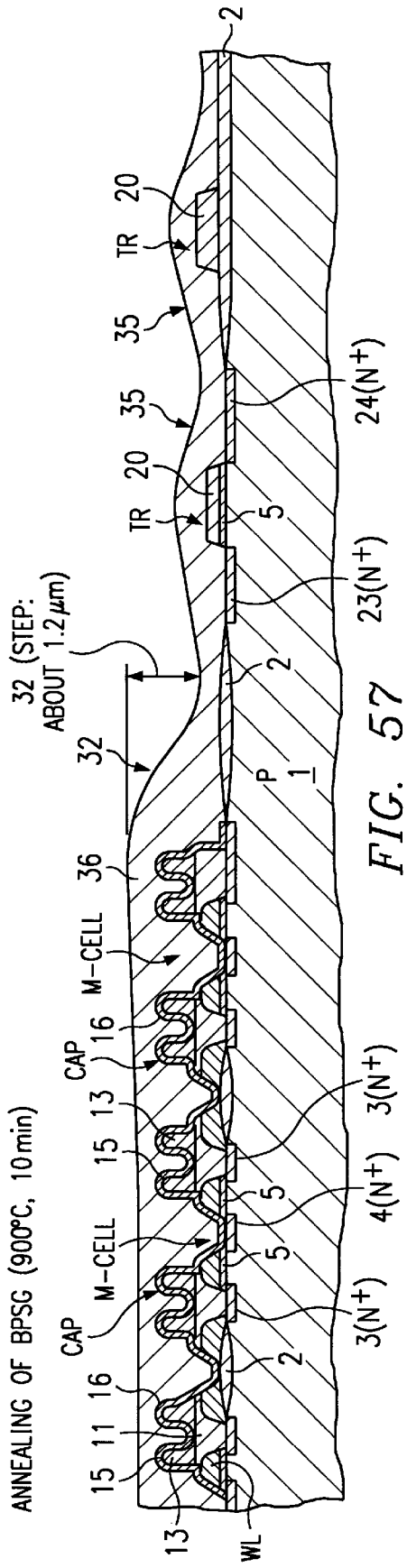
FIG. 57 shows a main cross section of yet another processing step.
Figure 58:
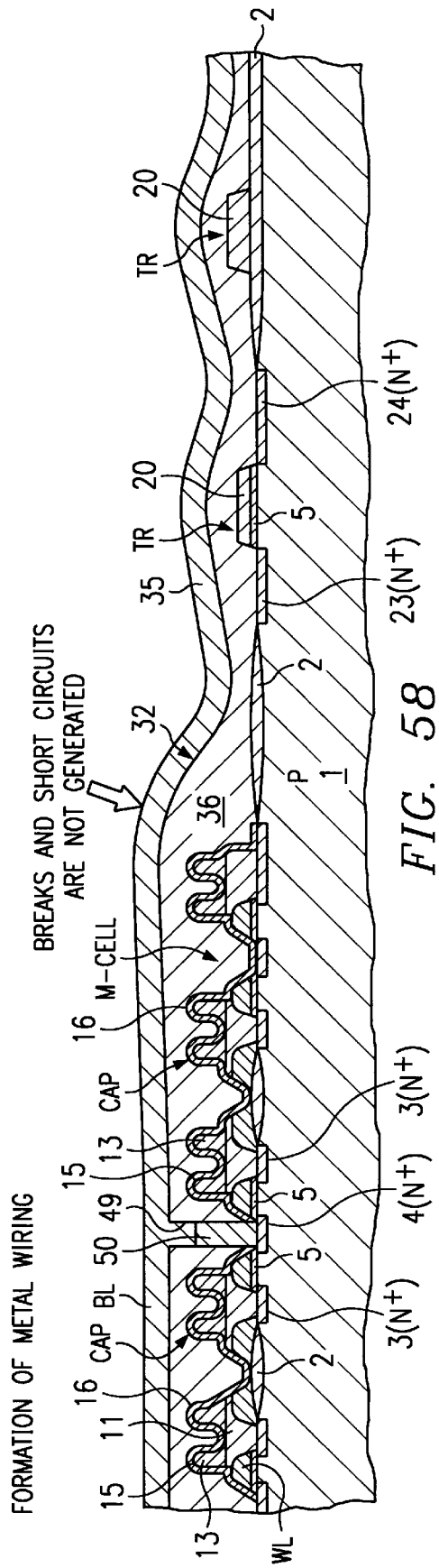
FIG. 58 is a main cross section of another processing step.

Convex part 368A of the $SiO_2$ layer is etched back according to an anisotropic dry etching process, where photoresist 370 has been used as the mask as shown in FIG. 50. Along with the reduction of convex part 368A to a thickness of 0.3 $\mu$m according to this etchback process, concave part 368B of elliptical cross section is formed on both sides of convex part 368A.

Photoresist 370 is removed as shown in FIG. 51, and as shown in FIG. 52, organic SOG layer 369 is deposited in a spin-coating process on $SiO_2$ layer 368 and cured and solidified at 450° C. In this state, concave part 368B is filled with SOG, and the surface of SOG layer 369 is flattened. Therefore, the element deposited in the postprocessing acquires the form and dimensions faithful to the design with high reliability.

SOG layer 369 is etched back and $Sio_2$ layer 368 is exposed as shown in FIG. 53.

$SiO_2$ layer 370 is formed on $SiO_2$ layer 368 and the residual SOG 369 according to the plasma CVD method as shown in FIG. 54.

Formation of the $SiO_2$ layer with the plasma CVD method is executed at a temperature of 300°–400° C., which is sufficiently lower than 660° C., the melting point of aluminum. Therefore, metal wiring 367 can be made from aluminum. Therefore, by forming the $SiO_2$ layer with the plasma CVD method, there is the advantage that the wiring material can be freely selected.

Even in this example, if the insulation is insufficient because convex part 368A of the $SiO_2$ layer has become thin due to the etchback process of FIG. 50, since $SiO_2$ layer 370 has been deposited with the plasma CVD method on SOG layer 369 in the same manner as described above and as shown in FIG. 53, the interlayer insulation between metal wiring 367 and the elements formed in the subsequent processes is ensured.

The embodiments of our invention are not restricted to the descriptions given above but can be further modified on the basis of the technical concepts of our invention.

For example, the parameters for the above-described pre-annealing, PEB, reflow process, and plasma CVD method and the pattern shape of the photoresist and its terminating part position can be changed. It is also preferable to execute the PEB process by dry etching due to the problem of undercutting the resist.

Also, the flattening method according to our invention is effective when flattening the steps which exist in various parts of the semiconductor device. In particular, steps with a height difference of 1 $\mu$m or more can be reduced to 0.3–0.8 $\mu$m or less, in addition to the values given in the examples.

Also, the layer which is the target layer for flattening is not limited to the BPSG or SOG layers. It can, of course, be other insulating layers.

Our invention can be applied to other semiconductor conductivity types or to other semiconductor memories or devices besides those of the DRAM with stacked-cell capacitors.

In our invention, an insulating layer is formed on a surface with irregularities and/or steps on the semiconductor substrate. A resist is formed on the surface except the projecting parts on the insulating layer, and the projecting parts of the insulating layer are removed with the resist acting as the mask. A prescribed layer is formed on the insulating layer after the resist is removed, and the irregularities and/or steps are covered with the insulating layer in which the surface is flattened, so that the surface can be easily flattened, and so that the steps and irregularities can be significantly reduced during subsequent processing.

Also, by eliminating the projecting part existing on the side lower than a given location of the step by heat treatment after removing the layer part by a prescribed thickness, flattening of the surface irregularities becomes still easier. This is because the projecting part remains after the layer part is removed by just a prescribed thickness and the volume has been minimized.

Furthermore, by eliminating the projecting part by heat-treating and flattening the surface of the layer, the photoresist can be exposed in accordance with the design pattern when the wiring on this layer is formed, so that multiple adjacent wiring can be formed to the prescribed width and intervals (or pitch).

Therefor, it is possible to form highly dense, fine wiring with a wide tolerance. In particular, if strict design rules for minimal wire width or spacing (e.g., less than 0.4 $\mu$m) are used, the tolerance for the focusing depth of the exposure during photolithography is not large, but now a large processing tolerance can be realized by flattening the steps according to our invention. Also, when aluminum wiring is used, breaks in the step part due to so-called electromigration during use can be suppressed to a minimum.

By essentially embedding the projecting part by depositing an insulating material and flattening the surface of the layer instead of employing heat treatment, functional effects similar to those obtained with the heat treatment can be realized.

In this case, the insulating layer prevents introduction of undesired impurities and the interlayer insulation becomes more reliable. As a result, a semiconductor device of high reliability can be obtained.

Also, the method according to our invention is superior in that it is an extension of the existing technology; merely by adding the required processes to the technology of the prior art, the generation of dust is minimized, the introduction of new equipment is not needed, etc.

What is claimed is:

1. A semiconductor device manufacturing method comprising the steps of:

forming a plurality of circuit elements of at least two substantially different heights on a common semiconductor substrate;

depositing over the circuit elements a common insulating layer whose top surface has substantial variation in height above the substrate;

depositing a resist mask layer over the insulating layer with openings over high portions of the insulating layer's top surface exceeding a first predetermined height;

etching down the insulating layer's high portions to a second predetermined height to make its overall top surface more even;

removing the resist mask layer; and forming on said evened insulating layer a working layer that would be easily damaged by substantial height variation of the insulating layer.

2. The method of claim 1 wherein the insulating layer comprises silicate glass.

3. The method of claim 2 further comprising, after the removing step, a step of heat treating the insulating layer to smooth any irregularities in its top surface.

4. The method of claim 1 wherein the insulating layer comprises silicon dioxide.

5. The method of claim 4 further comprising a step of spin-coating an SOG layer on the evened insulating layer.

6. The method of claim 5 comprising etching back the SOG layer so as to leave SOG filler in any concave portions of the silicon dioxide insulating layer and forming a second silicon dioxide insulating layer over the SOG-filled insulating layer.

7. The method of claim 1 wherein at the openings the resist layer terminates mid-slope of a step, and the high portion of the insulating layer is etched down uniformly by just a predetermined thickness.

8. The method of claim 7 further comprising a step of removing any projecting portions of the insulating layer remaining after the etching.

9. A semiconductor device manufacturing method comprising the steps of:

forming a semiconductor device, comprising a memory cell array portion having a cell height and a peripheral circuit portion having a circuit height together on a substrate, having a global step between the cell and circuit heights;

forming a common insulating layer over the memory cell array and peripheral circuit portions;

forming a resist layer with openings for high portions of the insulating layer above a predetermined height along the step between the cell and peripheral circuit portions;

etching down the high portions of the insulating layer by just a predetermined thickness;

removing the resist layer; and forming a working layer on the insulating layer.

10. A semiconductor device manufacturing method comprising the steps of:

forming a semiconductor device having a local step with a convex portion;

forming an insulating layer on the surface of said local step containing a convex portion;

forming a resist mask layer on the insulating layer, except for a projecting portion of the convex portion;

removing the projecting portion of the insulating layer by a predetermined thickness to even the insulating layer;

removing the resist mask layer; and forming a working layer on the evened insulating layer.

11. The method of claim 9 wherein the insulating layer is silicate glass.

* * * * *